(12) United States Patent
Kim et al.

(10) Patent No.: US 12,089,467 B2
(45) Date of Patent: Sep. 10, 2024

(54) DISPLAY DEVICE

(71) Applicant: Samsung Display Co., LTD., Yongin-si (KR)

(72) Inventors: Jong Hoon Kim, Seoul (KR); Jang Il Kim, Asan-si (KR); Jeong Ki Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 393 days.

(21) Appl. No.: 17/496,324

(22) Filed: Oct. 7, 2021

(65) Prior Publication Data
US 2022/0246684 A1 Aug. 4, 2022

(30) Foreign Application Priority Data

Jan. 29, 2021 (KR) .......................... 10-2021-0013682

(51) Int. Cl.
*H10K 59/38* (2023.01)
*H10K 59/122* (2023.01)

(52) U.S. Cl.
CPC ........... *H10K 59/38* (2023.02); *H10K 59/122* (2023.02)

(58) Field of Classification Search
CPC .... H10K 59/38; H10K 59/122; H10K 59/352; H10K 59/353; H10K 59/8792; G02B 5/201
USPC .......................................................... 257/79
See application file for complete search history.

(56) References Cited

U.S. PATENT DOCUMENTS

| 2003/0107314 A1* | 6/2003 | Urabe ................ H10K 59/8792 |
| | | 313/506 |
| 2020/0343310 A1 | 10/2020 | Bae et al. |
| 2021/0026192 A1 | 1/2021 | Kim et al. |
| 2021/0351238 A1 | 11/2021 | Park et al. |

FOREIGN PATENT DOCUMENTS

| EP | 3 731 280 | 10/2020 |
| JP | 2006-72176 | 3/2006 |
| JP | 2012-226032 | 11/2012 |
| KR | 10-0790866 | 1/2008 |
| WO | 2020/085606 | 4/2020 |

OTHER PUBLICATIONS

Extended European Search Report, corresponding to European Application No./Patent No. 22154030.5, dated Jun. 15, 2022.

\* cited by examiner

*Primary Examiner* — Fazli Erdem
(74) *Attorney, Agent, or Firm* — KILE PARK REED & HOUTTEMAN PLLC

(57) ABSTRACT

A display device includes a first substrate including a first emission area emitting light of a first color, a second emission area emitting light of a second color having a peak wavelength shorter than a peak wavelength of light of the first color, and a light blocking area which blocks light; a color filter layer disposed on a surface of the first substrate; and a wavelength control layer disposed on the color filter layer and including a bank layer and a wavelength control structure. The bank layer is disposed in the light blocking area on the color filter layer. The wavelength control structure is disposed in a first opening and the second opening of the bank layer. The first opening, the second opening, and the bank hole are spaced apart from each other. The bank hole surrounds an edge of the first opening.

20 Claims, 22 Drawing Sheets

FIG. 2
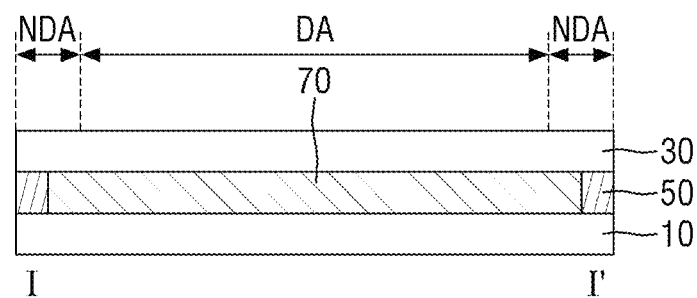
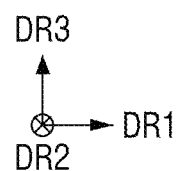

DISPLAY DEVICE

CROSS-REFERENCE TO RELATED APPLICATION(S)

This application claims priority to and the benefit of Korean Patent Application No. 10-2021-0013682 under 35 U.S.C. 119, filed on Jan. 29, 2021, in the Korean Intellectual Property Office (KIPO), the entire contents of which are incorporated herein by reference.

BACKGROUND

1. Technical Field

The disclosure relates to a display device.

2. Description of the Related Art

The importance of display devices has steadily increased with the development of multimedia technology. Accordingly, various types of display devices such as a liquid crystal display (LCD) device, an organic light emitting display (OLED) device and the like have been used.

Among the display devices, a self-light emitting display device includes a self-light emitting element such as an organic light emitting element. The self-light emitting element may include two opposite electrodes and a light emitting layer interposed therebetween. In the case of using the organic light emitting element as the self-light emitting element, the electrons and holes from the two electrodes are recombined in the light emitting layer to produce excitons, which transition from the excited state to the ground state, emitting light.

SUMMARY

Aspects of the disclosure provide a display device with improved display quality by minimizing defects in the display device due to loss of a bank or mislanding of ink in an inkjet process.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, there is provided a display device, the display device may include a first substrate including a first emission area emitting light of a first color, a second emission area emitting light of a second color having a peak wavelength shorter than a peak wavelength of light of the first color, and a light blocking area which blocks light; a color filter layer disposed on a surface of the first substrate; and a wavelength control layer disposed on the color filter layer and including a bank layer and a wavelength control structure. The bank layer may be disposed in the light blocking area on the color filter layer, and may include a first opening overlapping the first emission area, a second opening overlapping the second emission area, and a bank hole positioned in the light blocking area. The wavelength control structure may be disposed in the first opening and the second opening of the bank layer. The first opening, the second opening, and the bank hole may be spaced apart from each other. The bank hole may surround an edge of the first opening.

The first color may be red, and the second color may be blue or green.

The color filter layer may include a first color filter layer that selectively transmits light of the first color; and a second color filter layer that selectively transmits light of the second color. The first color filter layer may include a first color filter disposed in the first emission area; and a first color pattern disposed in the light blocking area. The second color filter layer may include a second color filter disposed in the second emission area; and a second color pattern disposed in the light blocking area. The first color pattern and the second color pattern may overlap each other in the light blocking area.

The color filter layer may include a third color filter layer that selectively transmits light of a third color different from the first color and the second color, and the third color filter layer may be disposed in the light blocking area, and includes a third color pattern overlapping the first color pattern and the second color pattern.

The bank hole may overlap the first color pattern, the second color pattern, and the third color pattern.

The first opening may overlap the first color filter, and the second opening may overlap the second color filter.

The bank hole may be disposed between the first opening and the second opening.

The bank layer may include a first bank and a second bank spaced apart from each other, the bank hole disposed between the first bank and the second bank, the first opening may be defined by the first bank, and the second opening may be defined by the second bank.

A sidewall of the first bank and a sidewall of the second bank may be adjacent to each other, may be spaced apart from each other, and may face each other.

The bank hole may include a plurality of sub-bank holes spaced apart from each other along the edge of the first opening in a plan view.

The wavelength control structure may include a first wavelength conversion pattern disposed in the first opening, and the first wavelength conversion pattern may include a first base resin; and a first wavelength conversion material dispersed in the first base resin and converting a peak wavelength of light into the peak wavelength of light of the first color.

The wavelength control structure may include a second wavelength conversion pattern disposed in the second opening. The second wavelength conversion pattern may include a second base resin; and a second wavelength conversion material dispersed in the second base resin and converting the peak wavelength of light into the peak wavelength of light of the second color.

At least a part of the bank hole may be disposed between the first wavelength conversion pattern and the second wavelength conversion pattern.

The wavelength control structure may include a light transmitting layer disposed in the second opening. The light transmitting layer may include a second base resin; and light scattering particles dispersed in the second base resin.

The display device may further a include first pattern disposed in the bank hole and including the first wavelength conversion material.

The display device may further include a first capping layer disposed on the color filter layer; and a second capping layer disposed on the wavelength control layer. The wavelength control layer may be disposed on the first capping layer, and the first capping layer and the second capping layer may directly contact each other in a region overlapping the bank hole.

The light blocking area may surround the first emission area and the second emission area.

A volume of the bank hole may be smaller than a volume of the first opening, and the volume of the bank hole may be smaller than a volume of the second opening.

The display device may further include a low refractive layer disposed between the color filter layer and the wavelength control layer. The low refractive layer may fill a part of the bank hole.

The display device may further include a second substrate facing the surface of the first substrate; a first electrode disposed on a surface of the second substrate; a pixel defining layer disposed on the first electrode and exposing at least a part of the first electrode; a light emitting layer disposed on the first electrode exposed by the pixel defining layer; a second electrode disposed on the light emitting layer; and a filling layer disposed between the second electrode and the wavelength control layer. The filling layer may fill a part of the bank hole.

According to the display device according to an embodiment, a bank hole may be formed to surround a first opening at an edge of the first opening in which a first wavelength conversion pattern including a first wavelength conversion material for converting blue light or green light into red light is disposed. Accordingly, a bank hole is formed between the first opening and the second and third openings, so that a material included in the first wavelength conversion pattern may be prevented from being introduced into the second and third openings in the process of forming the first wavelength conversion pattern in the first opening. Accordingly, the display quality of the display device may be improved by preventing the first wavelength conversion material that converts the wavelength of light from a short wavelength to a long wavelength from being introduced into the second wavelength conversion pattern or the light transmitting layer disposed in the second and third sub-pixels.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which:

FIG. 2 is a schematic cross-sectional view taken along line I-I' of FIG. 1;

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be understood that the terms "contact," "connected to," and "coupled to" may include a physical and/or electrical contact, connection or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described in detail with reference to the accompanying drawings.

Figure 1:
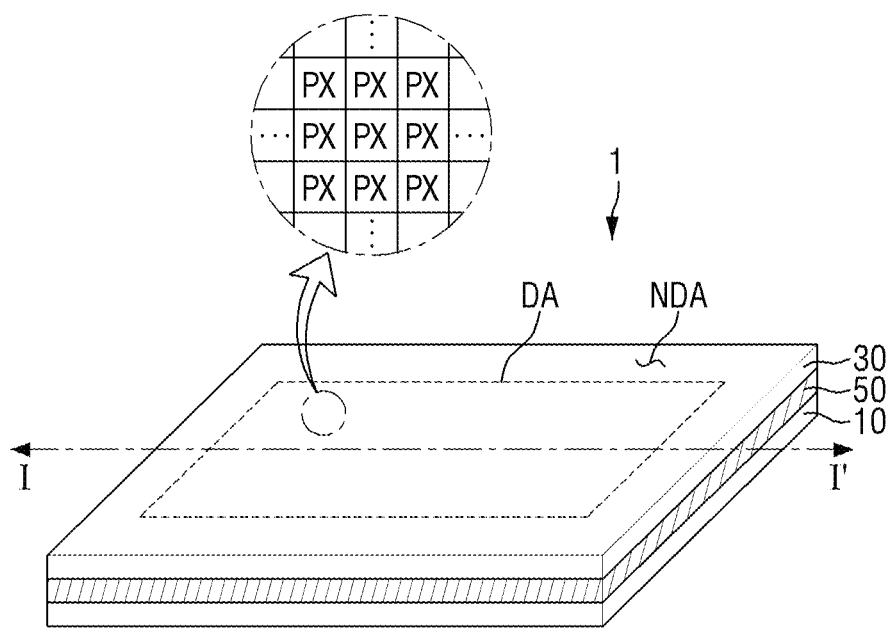
FIG. 1 is a schematic perspective view of a display device according to an embodiment.

FIG. 1 is a schematic perspective view of a display device according to an embodiment. FIG. 2 is a schematic cross-sectional view taken along line I-I' of FIG. 1.

Referring to FIGS. 1 and 2, a display device 1 may refer to any electronic device providing a display screen. Examples of the display device 1 may include a television, a laptop computer, a monitor, a billboard, a mobile phone, a smartphone, a tablet personal computer (PC), an electronic watch, a smartwatch, a watchphone, a mobile communication terminal, an electronic notebook, an electronic book, a portable multimedia player (PMP), a navigation device, a game console, a digital camera, an Internet of things (IoT) device and the like, which provide a display screen.

A first direction DR1, a second direction DR2, and a third direction DR3 are defined as shown in the drawing. The first direction DR1 and the second direction DR2 may be directions perpendicular to each other in a plane. The third direction DR3 may be a direction perpendicular to a plane on which the first direction DR1 and the second direction DR2 are located. The third direction DR3 is perpendicular to each of the first direction DR1 and the second direction DR2. In the embodiments, the third direction DR3 indicates a thickness direction of the display device 1.

In the embodiments, unless otherwise noted, the term "upward" or "upper side" refers to one side of the third direction DR3, which is the display direction, and similarly, the term "top surface" refers to a surface toward the one side of the third direction DR3. Further, the term "downward" or "lower side" refers to the other side of the third direction DR3, which is an opposite direction to the display direction, and the term "bottom surface" refers to a surface toward the other side of the third direction DR3.

The display device 1 may have a rectangular shape in a plan view. For example, the display device 1 may have a rectangular shape, in a plan view, having a long side in the first direction DR1 and a short side in the second direction DR2. A corner where the long side in the first direction DR1 and the short side in the second direction DR2 of the display device 1 meet may be right-angled or rounded with a predetermined curvature. The planar shape of the display device 1 is not limited to the exemplified one, but may have a circular shape or other shapes.

The display device 1 may include a display area DA displaying an image and a non-display area NDA not displaying an image. The display area DA may include pixels PX. The non-display area NDA may be located around the display area DA and may surround the display area DA.

The display device 1 may include a first display substrate 10 and a second display substrate 30 facing the first display substrate 10. The display device 1 may further include a sealing member 50 that couples or connects the first display substrate 10 to the second display substrate 30, and a filling layer 70 filled between the first display substrate 10 and the second display substrate 30.

The first display substrate 10 may emit light having a predetermined peak wavelength from emission areas of the display area DA. The first display substrate 10 may include elements and circuits for displaying an image. For example, the first display substrate 10 may include a pixel circuit such as a switching element, a pixel defining layer defining an emission area and a non-emission area of the display area DA, and a self-light emitting element. In an embodiment, the self-light emitting element may include at least one of an organic light-emitting diode (LED), a quantum dot light emitting diode, an inorganic micro light emitting diode (e.g., micro LED), or an inorganic nano light emitting diode (e.g., nano LED). Hereinafter, a case where the self-light emitting element is an organic light emitting diode will be described by way of example.

The second display substrate 30 may be disposed above the first display substrate 10 to face the first display substrate 10. The second display substrate 30 may transmit light by converting the peak wavelength of the light emitted from the first display substrate 10, or may transmit the light by maintaining the peak wavelength of the light emitted from the first display substrate 10.

A sealing member 50 may be positioned between the first display substrate 10 and the second display substrate 30 in the non-display area NDA. The sealing member 50 may be disposed along the edges of the first display substrate 10 and the second display substrate 30 in the non-display area NDA, and may surround the display area DA in a plan view. The first display substrate 10 and the second display substrate 30 may be coupled to each other by the sealing member 50.

A filling layer 70 may be disposed in a space between the first display substrate 10 and the second display substrate 30 surrounded by the sealing member 50. The filling layer 70 may fill the space between the first display substrate 10 and the second display substrate 30. The filling layer 70 may be made of a material that can transmit light. The filling layer 70 may include an organic material. For example, the filling layer 70 may be formed of a silicon (Si)-based organic material, an epoxy-based organic material, or the like, but is not limited thereto. The filling layer 70 may be omitted.

Figure 3:
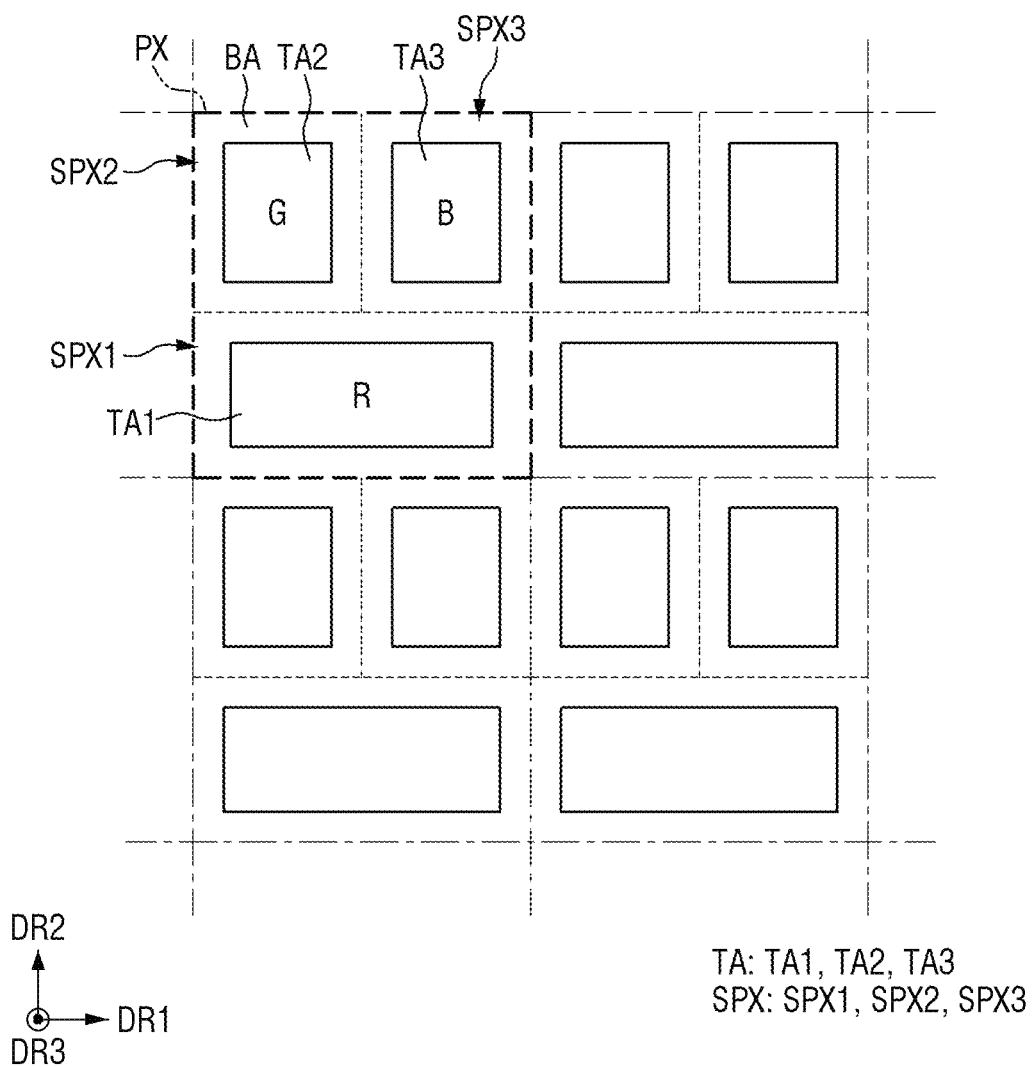
FIG. 3 is a schematic layout view illustrating a pixel arrangement of a display device according to an embodiment.

FIG. 3 is a schematic layout view illustrating a pixel arrangement of a display device according to an embodiment.

Referring to FIG. 3, the display area DA of the display device includes pixels PX. The pixel PX represents a repeated unit for display. In order to achieve full-color display, each pixel PX may include sub-pixels SPX (SPX1, SPX2, and SPX3) emitting different colors. For example, each pixel PX may include a first sub-pixel SPX1 for emitting light of a first color, a second sub-pixel SPX2 for emitting light of a second color, and a third sub-pixel SPX3 for emitting light of a third color. Although not limited to the following, the first color may be red, the second color may be green, and the third color may be blue. Each pixel PX may be provided with a first sub-pixel SPX1, a second sub-pixel SPX2, and a third sub-pixel SPX3.

The first to third sub-pixels SPX1, SPX2, and SPX3 in a pixel PX may be disposed in an arrangement referred to as an s-stripe type. For example, the second sub-pixel SPX2 and the third sub-pixel SPX3 may be disposed in odd rows and may be alternately disposed continuously in a row direction. The first sub-pixel SPX1 may be disposed in even rows and may be continuously disposed in the row direction. However, the arrangement of the first to third sub-pixels SPX1, SPX2 and SPX3 in a pixel PX is not limited thereto.

Each pixel PX may include emission areas TA and a light blocking area BA around the emission areas TA. The emission area TA may be an area in which light emitted from the first display substrate 10 is transmitted through the second display substrate 30 and is emitted to the outside of the display device 1, and the light blocking area BA may be an area through which light emitted from the first display substrate 10 is not transmitted.

The emission areas TA (TA1, TA2, and TA3) may include a first emission area TA1, a second emission area TA2, and a third emission area TA3. The first to third emission areas TA1, TA2, and TA3 may be emission areas of the first to third sub-pixels SPX1, SPX2, and SPX3, respectively. For example, the first emission area TA1 may be an emission area of the first sub-pixel SPX1, the second emission area TA2 may be an emission area of the second sub-pixel SPX2, and the third emission area TA3 may be an emission area of the third sub-pixel SPX3.

The first to third emission areas TA1, TA2, and TA3 may be disposed in a similar manner to the arrangement of the sub-pixels SPX in a pixel PX. For example, the first to third emission areas TA1, TA2, and TA3 may be disposed in an arrangement referred to as an s-stripe type within a pixel PX. For example, the second emission area TA2 and the third emission area TA3 may be disposed in odd rows and may be alternately disposed continuously in the row direction. The first emission area TA1 may be disposed in even rows and may be continuously disposed in the row direction.

The overall shape of each sub-pixel SPX may be similar to that of the emission area TA in the corresponding sub-pixel SPX, but the disclosure is not limited thereto. The planar shape and arrangement of the first to third emission areas TA1, TA2, and TA3 are not limited to the embodiment illustrated in FIG. 3 and may be variously modified.

The light blocking area BA may be disposed to surround the emission areas TA. The emission areas TA of the neighboring sub-pixels SPX may be distinguished by the light blocking area BA. The light blocking area BA of a sub-pixel SPX contacts the light blocking area BA of the neighboring sub-pixel SPX (regardless of whether or not it is the sub-pixel SPX in the same pixel PX). The light blocking areas BA of the neighboring sub-pixels SPX may be connected integrally (or integral with each other). Further, the light blocking area BA of a pixel PX may contact the light blocking area BA of the neighboring pixel PX, and the light blocking areas BA of the neighboring pixels PX may be integral with each other, so that the light blocking areas BA of all pixels PX may be integral with each other, but the present disclosure is not limited thereto.

The pixels PX including the sub-pixels SPX may be alternately arranged in a matrix. The shape and arrangement of the sub-pixels SPX may be the same for each pixel PX, but the disclosure is not limited thereto. The overall shape of each pixel PX including the sub-pixels SPX may be a substantially square shape. However, the disclosure is not limited thereto, and the shape of each pixel PX may be variously modified as a rhombus or a rectangle.

Figure 4:
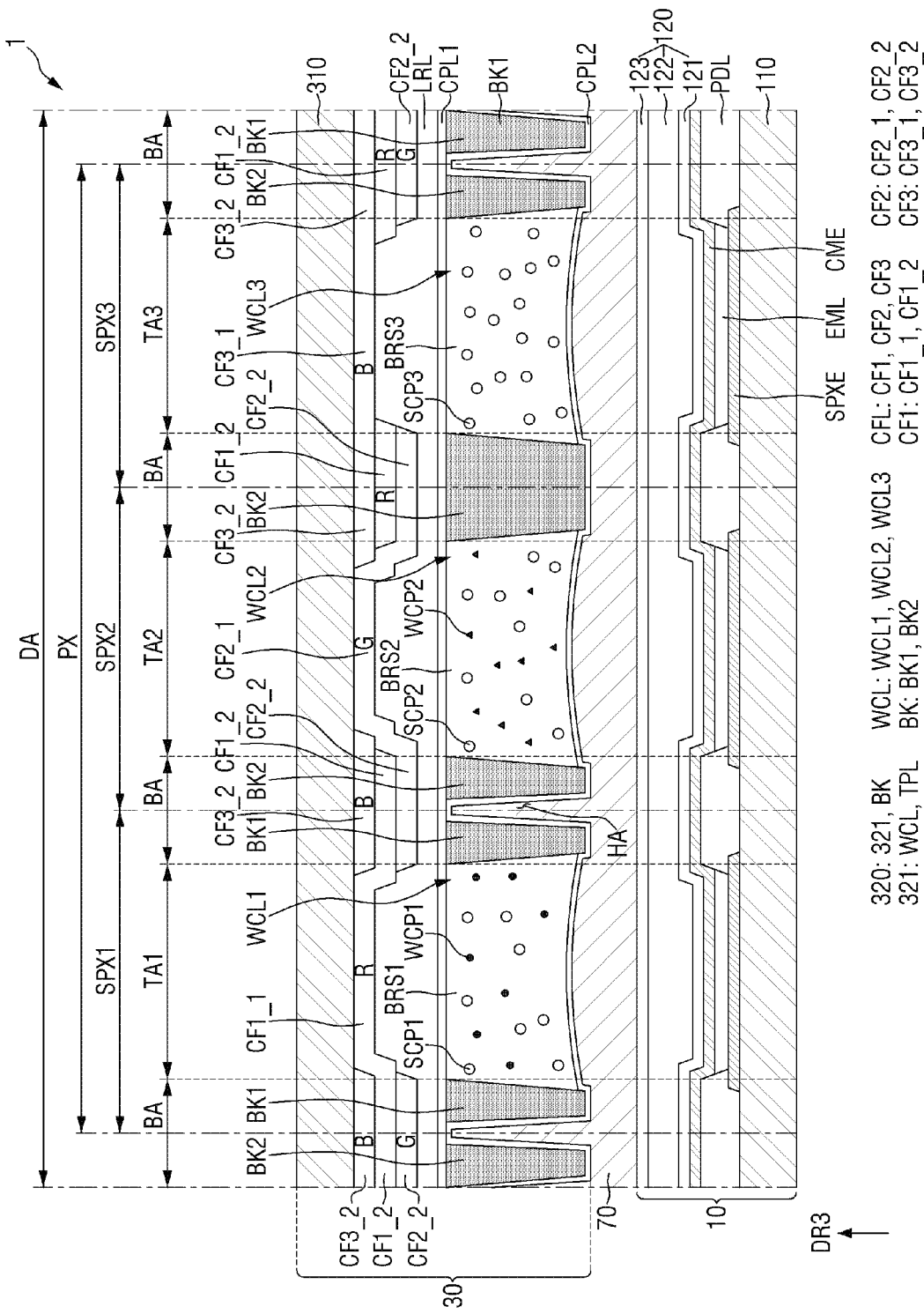
FIG. 4 is a schematic cross-sectional view of a display device according to an embodiment.

FIG. 4 is a schematic cross-sectional view of a display device according to an embodiment.

Referring to FIG. 4, the first display substrate 10 may include a first substrate 110, a pixel defining layer PDL disposed on a surface of the first substrate 110, light emitting elements, and a thin-film encapsulation structure 120 covering (or overlapping) the light emitting elements. The second display substrate 30 may include a second substrate 310, a color filter layer CFL disposed on a surface of the second substrate 310 facing the first substrate 110, a low refractive layer LRL, and a wavelength control layer 320 including a wavelength control structure 321 and a bank layer BK.

Hereinafter, the first display substrate 10 will be described in more detail. When sequentially describing the cross-sectional structure of the first display substrate 10 in an upward direction in the drawing, the first substrate 110 may be an insulating substrate. The first substrate 110 may include a transparent material. For example, the first substrate 110 may include a transparent insulating material such as glass, quartz, or the like. The first substrate 110 may be a rigid substrate. However, the first substrate 110 is not limited to the exemplified one. The first substrate 110 may include plastic such as polyimide (PI) or the like, and may have a flexible property so that it can be curved, bent, folded, or rolled.

Sub-pixel electrodes SPXE may be disposed on the surface of the first substrate 110. The sub-pixel electrode SPXE may be disposed for each sub-pixel SPX. The sub-pixel electrodes SPXE of the neighboring sub-pixels SPX may be separated from each other. A circuit layer (not shown) driving each sub-pixel electrode SPXE may be disposed between the first substrate 110 and the sub-pixel electrodes SPXE. The circuit layer may include thin-film transistors, capacitors, and the like.

The sub-pixel electrode SPXE may be a first electrode, e.g., an anode electrode of the light emitting element (or a light emitting diode). The sub-pixel electrode SPXE may have a stacked structure formed by stacking a material layer having a high work function, such as indium tin oxide (ITO), indium zinc oxide (IZO), zinc oxide (ZnO), and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof. The material layer having a high work function may be disposed above the reflective material layer and disposed closer to a light emitting layer EML. The sub-pixel electrode SPXE may have a multilayer structure such as ITO/Mg, ITO/MgF, ITO/Ag, and ITO/Ag/ITO, but is not limited thereto.

The pixel defining layer PDL may be disposed on a surface of the first substrate 110 along the boundaries of the sub-pixels SPX. The pixel defining layer PDL may be disposed on the sub-pixel electrodes SPXE and may include openings to expose the sub-pixel electrodes SPXE. The emission areas and the non-emission areas may be distinguished by the pixel defining layer PDL and the openings of the pixel defining layer PDL. The pixel defining layer PDL may separate and insulate the respective sub-pixel electrodes SPXE of the light emitting elements from each other.

The pixel defining layer PDL may include an organic insulating material such as acrylic resin, epoxy resin, phenolic resin, polyamide resin, polyimide resin, unsaturated polyester resin, polyphenylene resin, polyphenylenesulfide resin or benzocyclobutene (BCB). The pixel defining layer PDL may include an inorganic material.

The light emitting layer EML may be disposed on the sub-pixel electrode SPXE exposed by the pixel defining layer PDL. In an embodiment in which the display device 1 is an organic light emitting display, the light emitting layers EML may include an organic layer having an organic material. The organic layer may include an organic light emitting layer EML, and in some embodiments, may further include a hole injection/transport layer and/or an electron injection/transport layer, as an auxiliary layer for assisting in light emission. In an embodiment, in case that the display device is a micro LED display, a nano LED display or the like, the light emitting layer EML may include an inorganic material such as an inorganic semiconductor.

In some embodiments, the light emitting layer EML may have a tandem structure in which organic light emitting layers EML are superposed (or overlaps) in the thickness direction and a charge generation layer is disposed between the organic light emitting layers. The respective organic light emitting layers EML superposed may emit light of the same wavelength, or may emit light of different wavelengths. At least a part of the light emitting layer EML of each sub-pixel SPX may be separated from the light emitting layer EML of the neighboring sub-pixel SPX.

In an embodiment, the wavelengths of light emitted from the respective light emitting layers EML may be the same regardless of the sub-pixels SPX. For example, since the light emitting layer EML of each sub-pixel SPX emits blue light or ultraviolet light, and the wavelength control structure 321 included in the wavelength control layer 320 includes a wavelength conversion layer WCL (including first, second, and third wavelength conversion layer WCL1, WCL2, and WCL3), the display device 1 may display each color for each sub-pixel SPX.

In an embodiment, the wavelength of light emitted from each light emitting layer EML may be different for each sub-pixel SPX. For example, the light emitting layer EML of the first sub-pixel SPX1 may emit light of a first color, the light emitting layer EML of the second sub-pixel SPX2 may emit light of a second color, and the light emitting layer EML of the third sub-pixel SPX3 may emit light of a third color.

A common electrode CME may be disposed on the light emitting layer EML. The common electrode CME may contact the light emitting layers EML as well as the top surface of the pixel defining layer PDL.

The common electrode CME may be continuous across the sub-pixels SPX. The common electrode CME may be a full surface electrode disposed over the entire surface across all the sub-pixels SPX. The common electrode CME may be a second electrode (e.g., a cathode electrode) of a light emitting diode.

The common electrode CME may include a material layer having a low work function, such as Li, Ca, LiF/Ca, LiF/Al, Al, Mg, Ag, Pt, Pd, Ni, Au, Nd, Ir, Cr, BaF, Ba, or a compound or mixture thereof (e.g., a mixture of Ag and Mg). The common electrode CME may further include a transparent metal oxide layer disposed on the material layer having a low work function.

The sub-pixel electrode SPXE, the light emitting layer EML, and the common electrode CME may constitute a light emitting element (e.g., an organic light emitting element). Light emitted from the light emitting layer EML may be emitted in the display direction (e.g., the third direction DR3) through the common electrode CME.

A thin film encapsulation structure 120 (121, 122, and 123) may be disposed on the common electrode CME. The thin film encapsulation structure 120 may include at least one thin film encapsulation layer. For example, the thin film encapsulation layer may include a first inorganic film 121, an organic film 122, and a second inorganic film 123. Each of the first inorganic film 121 and the second inorganic film 123 may include silicon nitride, silicon oxide, silicon oxynitride, or the like. The organic film 122 may include an organic insulating material such as acrylic resin, epoxy resin, phenolic resin, polyamide resin, polyimide resin, unsaturated polyester resin, polyphenylene resin, polyphenylenesulfide resin, or benzocyclobutene (BCB).

Hereinafter, the second display substrate 30 will be described in more detail.

The second display substrate 30 may be disposed above the thin film encapsulation structure 120 of the first display substrate 10 to face the thin film encapsulation structure 120. As illustrated in FIG. 4, in case that the cross-sectional structure of the second display substrate 30 is sequentially described in a direction opposite to the third direction DR3, for example, in a downward direction, the second substrate 310 of the second display substrate 30 may include a transparent material. For example, the second substrate 310 may include a transparent insulating material such as glass, quartz, or the like. The second substrate 310 may be a rigid substrate. However, the second substrate 310 is not limited to the exemplified one. The second substrate 310 may include plastic such as polyimide (PI) or the like, and may have a flexible property so that it can be curved, bent, folded, or rolled.

The second substrate 310 and the first substrate 110 may be the same substrate, but may have different materials, thicknesses, transmittances, and the like. For example, the second substrate 310 may have a higher transmittance than the first substrate 110. Since the second substrate 310 includes a light transmitting material, light emitted from the first to third emission areas TA1, TA2, and TA3 may be transmitted to the outside of the display device 1. The second substrate 310 may be thicker or thinner than the first substrate 110.

The color filter layer CFL may be disposed on a surface of the second substrate 310 facing the first substrate 110. The color filter layer CFL may include a material that transmits light in a wavelength band representing a specific color and blocks or absorbs light in a wavelength band representing a color different from the specific color. The color filter layer CFL may be disposed in the emission area TA and the light blocking area BA of each sub-pixel SPX. The color filter layer CFL disposed in the emission area TA of each sub-pixel SPX may block the emission of light of a color different from the corresponding color of each sub-pixel SPX, and the color filter layer CFL disposed in the light blocking area BA may block or absorb light so that light is not emitted through the light blocking area BA.

The color filter layer CFL may include a first color filter layer CF1, a second color filter layer CF2, and a third color filter layer CF3. Each color filter layer CFL (CF1, CF2, and CF3) may transmit light of a specific color and may block or absorb light of a color different from the specific color.

The first color filter layer CF1 may include a material that selectively transmits light of a first color (e.g., red light) and that blocks or absorbs light of a second color (e.g., green light) and light of a third color (e.g., blue light) different from the first color. In an embodiment, the first color filter layer CF1 may be a red color filter layer and may include a red colorant such as a red dye or a red pigment.

The first color filter layer CF1 may be disposed in the first emission area TA1 and the light blocking area BA of the first sub-pixel SPX1. The first color filter layer CF1 may include a first color filter CF_1 and a first color pattern CF_2. The first color filter CF_1 and the first color pattern CF_2 may be integrated (or integral with each other) to form a single pattern.

The first color filter CF1_1 may be disposed in the first emission area TA1 of the first sub-pixel SPX1. The first color filter CF1_1 may be disposed on a surface of the second substrate 310 in the first emission area TA1 of the first sub-pixel SPX1.

The first color pattern CF_2 may be disposed in the light blocking area BA. The first color pattern CF_2 may be disposed on a third color pattern CF3_2 to be described below in the light blocking area BA. The first color pattern CF_2 may be disposed over the entire area of the light blocking area BA of a pixel PX.

The second color filter layer CF2 may include a material that selectively transmits light of a second color (e.g., green light) and that blocks or absorbs light of a first color (e.g., red light) and a third color (e.g., blue light) different from the second color. In an embodiment, the second color filter layer CF2 may be a green color filter layer and may include a green colorant such as a green dye or a green pigment.

The second color filter layer CF2 may be disposed in the second emission area TA2 and the light blocking area BA of the second sub-pixel SPX2. The second color filter layer CF2 may include a second color filter CF2_1 and a second color pattern CF2_2. The second color filter CF2_1 and the second color pattern CF2_2 may be integral with each other to form a single pattern.

The second color filter CF2_1 may be disposed in the second emission area TA2 of the second sub-pixel SPX2. The second color filter CF2_1 may be disposed on the surface of the second substrate 310 in the second emission area TA2 of the second sub-pixel SPX2.

The second color pattern CF2_2 may be disposed in the light blocking area BA. The second color pattern CF2_2 may be disposed on the first color pattern CF_2 and the third color pattern CF3_2 in the light blocking area BA. The second color pattern CF2_2 may be disposed over the entire area of the light blocking area BA of a pixel PX.

The third color filter layer CF3 may include a material that selectively transmits light of a third color (e.g., blue light) and that blocks or absorbs light of a first color (e.g., red light) and light of a second color (e.g., green light) different from the third color. In an embodiment, the third color filter layer CF3 may be a blue color filter layer and may include a blue colorant such as a blue dye or a blue pigment.

The third color filter layer CF3 may be disposed in the third emission area TA3 and the light blocking area BA of the third sub-pixel SPX3. The third color filter layer CF3 may include a third color filter CF3_1 and the third color pattern CF3_2. The third color filter CF3_1 and the third color pattern CF3_2 may be integral with each other to form a single pattern.

The third color filter CF3_1 may be disposed in the third emission area TA3 of the third sub-pixel SPX3. The third color filter CF3_1 may be disposed on the surface of the second substrate 310 in the third emission area TA3 of the third sub-pixel SPX3.

The third color pattern CF3_2 may be disposed in the light blocking area BA. The third color pattern CF3_2 may be disposed on a surface of the second substrate 310 in the light blocking area BA. The third color pattern CF3_2 may be disposed over the entire area of the light blocking area BA of a pixel PX.

The first to third color filters CF1_1, CF2_1, and CF3_1 may be disposed in the emission areas TA1, TA2, and TA3 of the first to third sub-pixels SPX1, SPX2, and SPX3, respectively, and thus may block the emission of light of a color other than the color corresponding to each sub-pixel SPX.

The first to third color patterns CF1_2, CF2_2, and CF3_2 may be disposed to overlap each other in the third direction DR3 in the light blocking area BA. In the light blocking area BA, the third color pattern CF3_2 may be disposed on a surface of the second substrate 310, the first color pattern CF1_2 may be disposed on the third color pattern CF3_2, and the second color pattern CF2_2 may be disposed on the first color pattern CF1_2. As the first to third color patterns CF1_2, CF2_2, and CF3_2 are disposed to overlap in the third direction DR3 in the light blocking area BA, although light is incident on the light blocking area BA, all of light of the red color, light of the green color, and light of the blue color in the light may be blocked by the first to third color patterns CF1_2, CF2_2, and CF3_2. Accordingly, the light may not be emitted from the light blocking area BA to the outside of the display device 1 by the first to third color patterns CF1_2, CF2_2, and CF3_2. The first to third color patterns CF1_2, CF2_2, and CF3_2 disposed to overlap the light blocking area BA may not only block light emission from the display device, but also suppress reflection of external light.

In an embodiment, a separate light absorbing member (not shown) may be disposed on the second substrate 210. The light absorbing member (not illustrated) may be disposed in the light blocking area BA. The light absorbing member may include a light absorbing material that absorbs light in a visible light wavelength band. For example, the light absorbing member may be made of a material used as a black matrix of the display device 1. The light absorbing member may be a type of light blocking member.

The low refractive layer LRL may be disposed on the color filter layer CFL. The low refractive layer LRL may be disposed over the emission area TA and the light blocking area BA, and the low refractive layer LRL may have a lower refractive index than the wavelength control structure 321. For example, the low refractive layer LRL may have a refractive index of about 1.1 or greater and about 1.4 or less, but the disclosure is not limited thereto.

The low refractive layer LRL may reflect a part of the light, which is emitted in a direction from the wavelength control structure 321 disposed therebelow toward the color filter layer CFL, toward the wavelength control structure 321. For example, although a part of the light that is transmitted through the wavelength control structure 321 and proceeds to the color filter layer CFL, does not have the color of the corresponding sub-pixel SPX, the low refractive layer LRL reflects the light toward the wavelength control structure 321 to recycle the light, so that light utilization efficiency and wavelength conversion efficiency may be improved. Accordingly, the amount of light transmitted through the color filter layer CFL to be emitted to the outside of the display device 1 is increased, so that the light efficiency of the display device 1 may be improved.

The low refractive layer LRL may include an organic material and may include particles dispersed therein. The particles included in the low refractive layer LRL may be at least one of zinc oxide (ZnO) particles, titanium dioxide ($TiO_2$) particles, hollow silica particles, non-hollow silica particles, nanosilicate particles, or porogen particles.

In case that the low refractive layer LRL is made of (or includes) an organic layer, its bottom surface may be substantially flat despite its upper stepped portion. The low refractive layer LRL may completely cover the bottom surface of the color filter layer CFL. In spite of the level difference (or height difference) between the emission area TA and the light blocking area Ba of the color filter layer CFL, the bottom surface of the low refractive layer LRL may be substantially flat.

A first capping layer CPL1 may be disposed on the low refractive layer LRL. The first capping layer CPL1 may prevent impurities such as moisture or air from permeating from the outside and damaging or contaminating the color filter layer CFL and the low refractive layer LRL.

The first capping layer CPL1 may directly contact a surface (the bottom surface in FIG. 4) of the low refractive layer LRL. The first capping layer CPL1 may be made of an inorganic material. For example, the first capping layer CPL1 may include silicon nitride, aluminum nitride, zirconium nitride, titanium nitride, hafnium nitride, tantalum nitride, silicon oxide, aluminum oxide, titanium oxide, tin oxide, silicon oxynitride, or the like.

The wavelength control layer 320 may be disposed on the first capping layer CPL1. The wavelength control layer 320 may control the wavelength of light emitted from the first display substrate 10 and incident on the emission area TA and may convert or transmit light of a corresponding color of each sub-pixel SPX. The wavelength control layer 320 may block or absorb light emitted from the first display substrate 10 and incident on the light blocking area BA.

The wavelength control layer 320 may include the wavelength control structure 321 and the bank layer BK.

The bank layer BK may be disposed on the first capping layer CPL1. The bank layer BK may be disposed in the light blocking area BA along the boundary of each sub-pixel SPX in a pixel PX. The bank layer BK may overlap the pixel defining layer PDL and/or the first to third color patterns CF1_2, CF2_2, and CF3_2 in the third direction DR3. The bank layer BK may not be disposed in the emission area TA of each sub-pixel SPX. The bank layer BK may not overlap the first to third color filters CF1_1, CF2_1, and CF3_1 disposed in the emission area TA in the third direction DR3. For example, the bank layer BK may expose the first to third color filters CF1_1, CF2_1, and CF3_1 disposed in the emission area TA, in the third direction DR3.

The bank layer BK may include an organic material. The bank layer BK may include a light absorbing material that absorbs light in a visible wavelength band. In an embodiment, the bank layer BK may include an organic light blocking material. The bank layer BK may be a type of light blocking member.

The bank layer BK may be made of a material capable of blocking light transmission to prevent light infiltration into the adjacent sub-pixels SPX, which causes color mixture. When forming the wavelength control structure 321 in a manner such as an inkjet process in the process of forming the wavelength control structure 321 to be described below, the bank layer BK may also function as a partition wall that guides an ink composition to be stably injected at a desired position.

The bank layer BK disposed in a pixel PX may include a bank hole HA that penetrates the bank layer BK and surrounds the first emission area TA1 of the first sub-pixel SPX1. The bank layer BK may include a first bank BK1 disposed on a side of the first emission area TA1 with respect to the bank hole HA, and a second bank BK2 disposed on an opposite side of the first emission area TA1 with respect to the bank hole HA. A detailed description of the first bank BK1, the second bank BK2, and the bank hole HA will be given below with reference to other drawings.

The wavelength control structure 321 may be disposed on the first capping layer CPL1. The wavelength control structure 321 may be disposed in the emission area TA of each sub-pixel SPX. The wavelength control structure 321 may be disposed in an area partitioned by the bank layer BK in the emission area TA.

The wavelength control structure 321 may include the wavelength conversion layer WCL that converts the wavelength of incident light and/or a light transmitting layer TPL that transmits incident light while maintaining the wavelength of the incident light. The wavelength conversion layer WCL and/or the light transmitting layer TPL may be disposed to be separated for each sub-pixel SPX. The wavelength conversion layer WCL or the light transmitting layer TPL may overlap the emission area TA in the thickness direction of the display device 1. The neighboring wavelength conversion layers WCL or light transmitting layers TPL may be separated from each other. The separation space may overlap the light blocking area BA.

The wavelength conversion layer WCL may be disposed in the sub-pixel SPX in which the wavelength of light incident from the light emitting layer EML needs to be converted because the wavelength is different from that of the color of the corresponding sub-pixel SPX. The light transmitting layer TPL may be disposed in the sub-pixel SPX in which the wavelength of light incident from the light emitting layer EML is identical to that of the color of the corresponding sub-pixel SPX. The illustrated embodiment corresponds to a case where the light emitting layer EML of each sub-pixel SPX emits light of a third color, and shows an example in which the wavelength conversion layer WCL is disposed in the first sub-pixel SPX1 and the second sub-pixel SPX2 and the light transmitting layer TPL is disposed in the third sub-pixel SPX3. As another example, in case that the light emitting layer EML of each sub-pixel SPX emits light, such as ultraviolet light, having a wavelength different from that of the color of each sub-pixel SPX, only the wavelength conversion layer WCL may be provided, without requiring the light transmitting layer TPL. As still another example, in case that the light emitting layer EML of each sub-pixel SPX emits light corresponding to the color of each sub-pixel SPX, only the light transmitting layer TPL may be provided without requiring the wavelength conversion layer WCL, or the light transmitting layer TPL may be omitted in all sub-pixels SPX.

In the illustrated embodiment, the wavelength conversion layer WCL may include a first wavelength conversion pattern WCL1 disposed in the first sub-pixel SPX1 and a second wavelength conversion pattern WCL2 disposed in the second sub-pixel SPX2.

The first wavelength conversion pattern WCL1 may contain a first base resin BRS1 and a first wavelength conversion material WCP1 dispersed in the first base resin BRS1. The first wavelength conversion pattern WCL1 may further contain first scatterers SCP1 dispersed in the first base resin BRS1. The second wavelength conversion pattern WCL2 may include a second base resin BRS2 and a second wavelength conversion material WCP2 provided in the second base resin BRS2. The second wavelength conversion pattern WCL2 may further contain second scatterers SCP2 dispersed in the second base resin BRS2. The light transmitting layer TPL may include a third base resin BRS3 and third scatterers SCP provided in the third base resin BRS3.

The first to third base resins BRS1, BRS2, and BRS3 may include a light transmitting organic material. For example, the first to third base resins BRS1, BRS2, and BRS3 may include an epoxy resin, an acrylic resin, a cardo resin, an imide resin, or the like. The first to third base resins BRS1, BRS2 and BRS3 may be formed of a same material, but the disclosure is not limited thereto.

The first to third scatterers SCP1, SCP2, and SCP3 may contain metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like.

The first wavelength conversion material WCP1 may convert blue light into red light, and the second wavelength conversion material WCP2 may convert blue light into green light. The first wavelength conversion material WCP1 and the second wavelength conversion material WCP2 may be quantum dots, quantum bars, phosphors or the like. Examples of the quantum dot may include group IV nanocrystal, group II-VI compound nanocrystal, group III-V compound nanocrystal, group IV-VI nanocrystal, and a combination thereof.

The light transmitting layer TPL disposed in the third sub-pixel SPX3 transmits blue light incident from the light emitting layer EML while maintaining the wavelength thereof. The third scatterers SCP3 included in the light transmitting layer TPL may scatter the light and control an emission angle of the light emitted through the light transmitting layer TPL. The light transmitting layer TPL may not include a wavelength conversion material.

A second capping layer CPL2 may be disposed on the wavelength control layer 320. The second capping layer CPL2 may be formed of an inorganic material. The second capping layer CPL2 may include a material selected from the above-mentioned materials of the first capping layer CPL1. The second capping layer CPL2 and the first capping layer CPL1 may be made of (or include) the same material, but the disclosure is limited thereto.

The second capping layer CPL2 may cover (or overlap) the wavelength control layer 320. Specifically, the second capping layer CPL2 may cover each of the first and second wavelength conversion patterns WCL1 and WCL2, the light transmitting layer TPL, and the bank layer BK disposed on each sub-pixel SPX. The second capping layer CPL2 may cover not only a surface of the bank layer BK but also the side surface thereof. The second capping layer CPL2 may cover the first capping layer CPL1 exposed by the bank hole HA of the bank layer BK in the light blocking area BA.

The filling layer 70 may be disposed between the first display substrate 10 and the second display substrate 30. The filling layer 70 may fill a space between the first display substrate 10 and the second display substrate 30 and may bond them to each other. The filling layer 70 may be disposed between the thin film encapsulation structure 120 of the first display substrate 10 and the second capping layer CPL2 of the second display substrate 30. The filling layer 70 may fill the bank hole HA included in the bank layer BK. However, the disclosure is not limited thereto. The filling layer 70 may be formed of an Si-based organic material, an epoxy-based organic material, or the like, but is not limited thereto.

Figure 5:
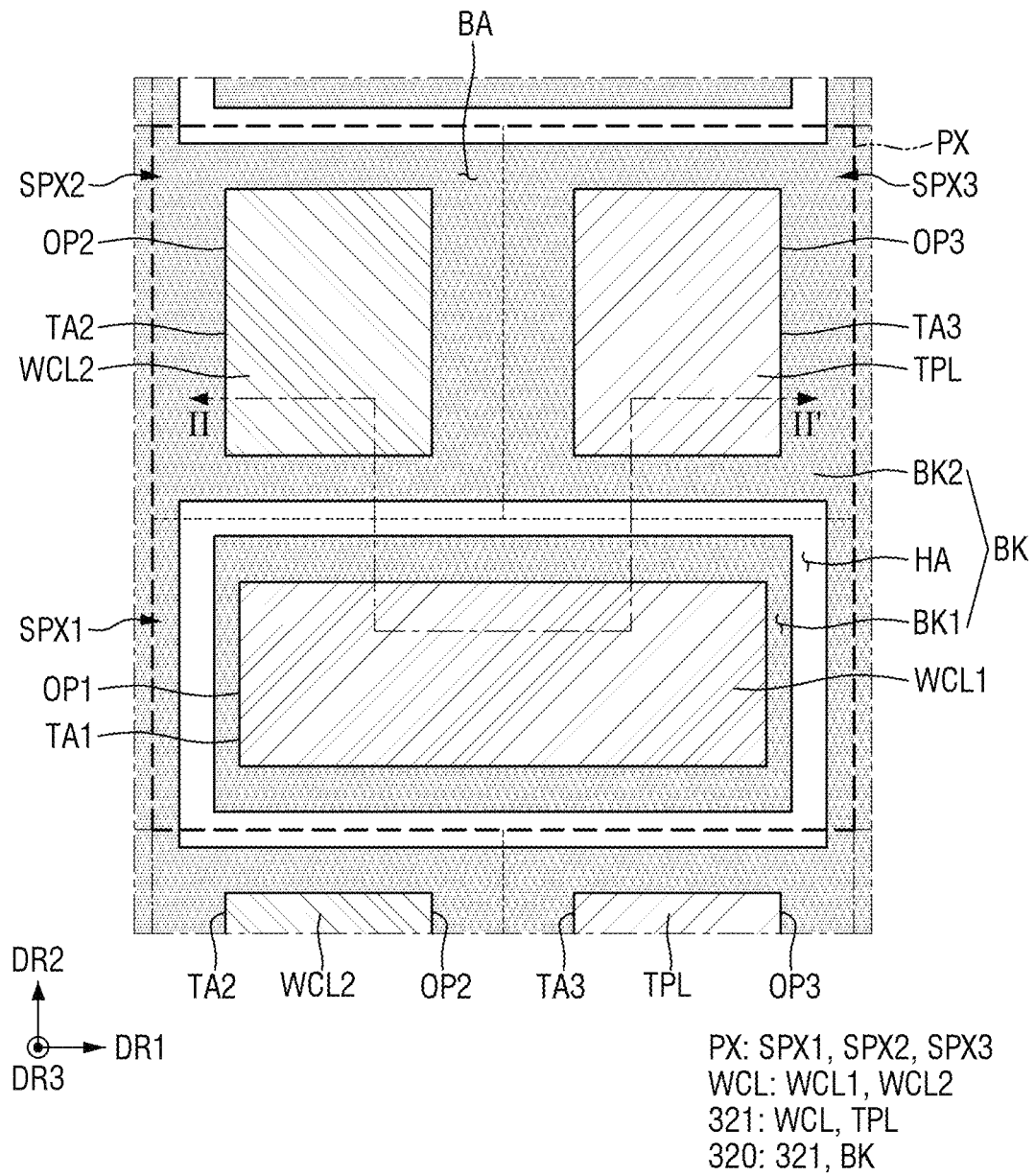
FIG. 5 is a schematic plan layout view illustrating a relative disposition of an emission area, a light blocking area, and a wavelength control layer of a display device according to an embodiment.
Figure 6:
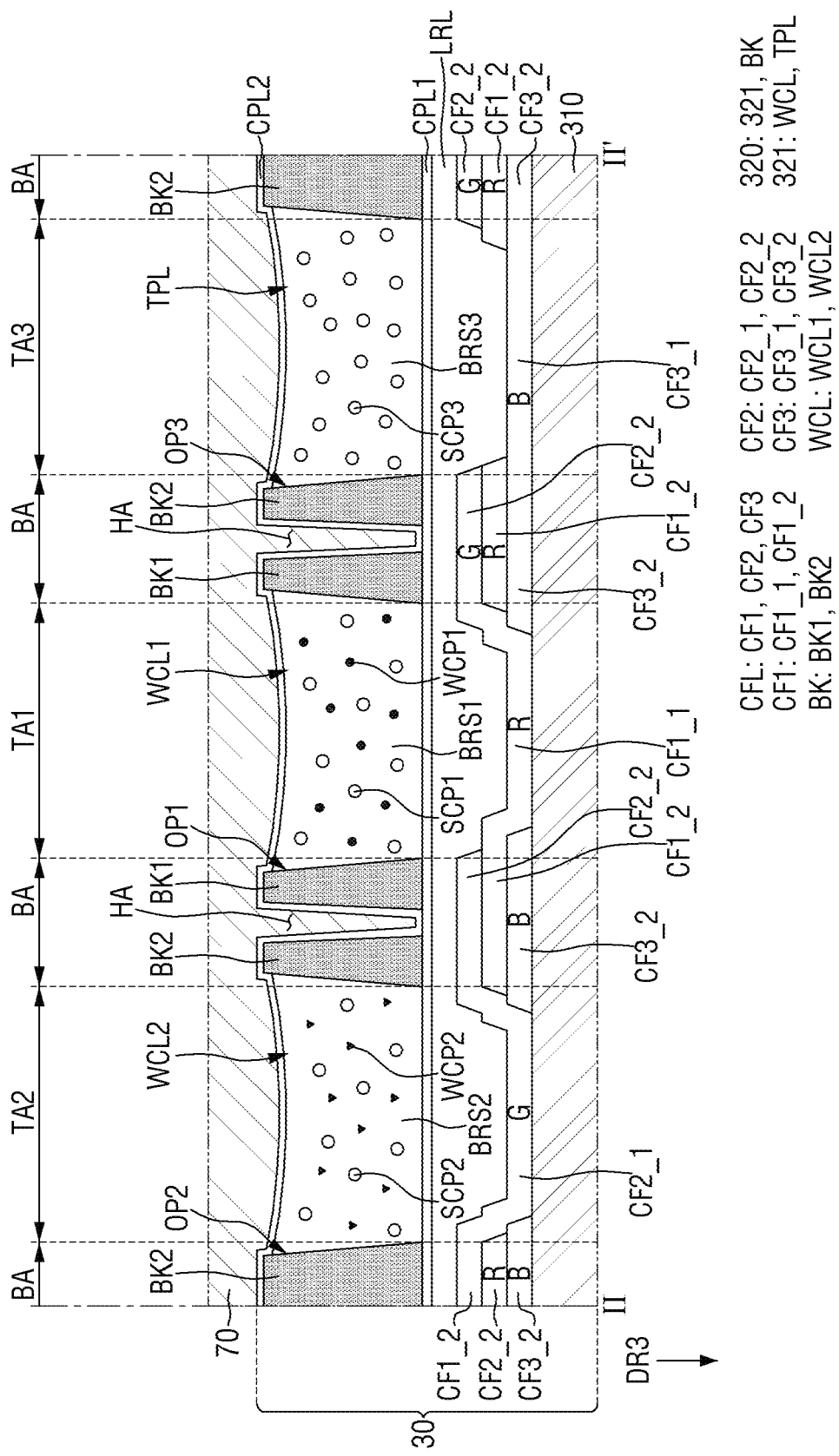
FIG. 6 is a schematic cross-sectional view of a second display device taken along line II-II' of FIG. 5.

FIG. 5 is a schematic plan layout view illustrating a relative disposition of an emission area, a light blocking area, and a wavelength control layer of a display device according to an embodiment. FIG. 6 is a schematic cross-sectional view of a second display device taken along line II-II' of FIG. 5.

FIG. 6 illustrates the second display substrate 30 of FIG. 4 in an upside-down state for simplicity of description. For example, in FIG. 6, the downward direction may be the third direction DR3.

First, a relative planar disposition between the emission area TA, the light blocking area BA, and the wavelength control layer 320 in a pixel PX will be described with reference to FIG. 5.

The bank layer BK may be disposed in the light blocking area BA in a pixel PX. The bank layer BK may not be disposed in the emission area TA of each sub-pixel SPX in a pixel PX. The bank layer BK may define the light blocking area BA and the emission area TA.

The bank layer BK may include holes penetrating the bank layer BK in the third direction DR3 (or thickness direction). The holes may include openings OP1, OP2, and OP3 disposed in the emission area TA, and the bank hole HA disposed in the light blocking area BA. The openings OP1, OP2, and OP3 and the bank hole HA may not overlap each other. Hereinafter, for simplicity of description, holes disposed in the emission area TA will be referred to as the openings OP1, OP2, and OP3, and holes disposed in the light blocking area BA will be referred to as the bank hole HA.

The bank layer BK may define the openings OP1, OP2, and OP3 partially exposing the first capping layer CPL1 in the emission area TA. The openings OP1, OP2, and OP3 may be disposed in the emission area TA of each sub-pixel SPX and may overlap the emission area TA of each sub-pixel SPX in the thickness direction.

The openings OP1, OP2, and OP3 defined by the bank layer BK may include first to third openings OP1, OP2, and OP3. The first opening OP1 may overlap the first emission area TA1 of the first sub-pixel SPX1, the second opening OP2 may overlap the second emission area TA2 of the second sub-pixel SPX2, and the third opening OP3 may overlap the third emission area TA3 of the third sub-pixel SPX3. The first opening OP1 may overlap the first color filter CF1_1, the second opening OP2 may overlap the second color filter CF2_1, and the third opening OP3 may overlap the third color filter CF3_1.

The wavelength control structure 321 may be disposed in the openings OP1, OP2, and OP3 defined as areas partitioned by the bank layer BK. Specifically, the first wavelength conversion pattern WCL1 may be disposed in the first opening OP1 defined by the bank layer BK in an area overlapping the first emission area TA1. The second wavelength conversion pattern WCL2 may be disposed in the second opening OP2 defined by the bank layer BK in an area overlapping the second emission area TA2. The light transmitting layer TPL may be disposed in the third opening OP3 defined by the bank layer BK in an area overlapping the third emission area TA3.

The bank layer BK may define the bank hole HA partially exposing the first capping layer CPL1 in the light blocking area BA. The bank hole HA may be disposed in the light blocking area BA and may not overlap the emission area TA in the thickness direction. The bank hole HA may overlap the first to third color patterns CF1_2, CF2_2, and CF3_2 disposed in the light blocking area BA in the thickness direction.

The bank hole HA may be disposed to surround the edge of the first emission area TA1 (or the first opening OP1) of the first sub-pixel SPX emitting light of the red color. The bank hole HA may be spaced apart from the first opening OP1 and may be formed to have a continuous strip-shaped groove at the edge of the first opening OP1. The bank hole HA may be parallel to each side of the first opening OP1 in a plan view and may be formed to be longer than the length of each side. The bank hole HA may be disposed to surround each side of the first opening OP1 in a plan view.

The bank hole HA is disposed between each of the openings OP1, OP2, and OP3 of the other adjacent sub-pixels SPX, and the first opening OP1 of the first sub-pixel SPX1. Specifically, the bank hole HA may be disposed between the first opening OP1 and the second and third openings OP2 and OP3 disposed above and below the first opening OP1, or may be disposed between the first opening OP1 of another neighboring pixel PX disposed on the left side or right side of the first opening OP1 and adjacent in the first direction DR1 and the first opening OP1 of the corresponding pixel PX.

The bank hole HA may prevent the material included in the first wavelength conversion pattern WCL1 disposed in the first opening OP1 from being introduced into the second and third openings OP2 and OP3. Specifically, in an embodiment, the wavelength control structure 321 may be formed by an inkjet printing method during a manufacturing process of the display device 1. In case that the wavelength control structure 321 is formed by the inkjet printing method, a defect may occur such that the ink corresponding to each wavelength control structure 321 may misland in an area other than the corresponding opening, or a portion of the bank layer BK between the openings OP1, OP2, and OP3 may be lost.

On the other hand, the wavelength conversion material may be a material that converts light, having a peak wavelength in a first wavelength band, into light having a peak wavelength in a second wavelength band longer than the first wavelength band. Accordingly, the wavelength conversion material may not convert light, having a peak wavelength in the second wavelength band longer than the first wavelength band, into light having a short wavelength in the first wavelength band. Accordingly, among red light, green light, and blue light, red light having a long wavelength may not be converted into green light or blue light having a short wavelength. Accordingly, in case that the first wavelength conversion material WCP1 capable of converting blue light or green light, which is light in a short wavelength band, into red light, which is light in a long wavelength band, is introduced into the second and third openings OP2 and OP3 of the second and third sub-pixels SPX2 and SPX3 representing a blue color or green color, a part of the light emitted from the light emitting layer EML and incident on the second and third sub-pixels SPX2 and SPX3 may be converted into red light by the first wavelength conversion material WCP1. The red light may be blocked by the second and third color filters CF2 and CF3 disposed thereon and may not be emitted to the outside. Accordingly, since the first wavelength conversion material WCP1 is introduced into another sub-pixel, the luminance of light of the corresponding sub-pixel SPX may be lowered.

Accordingly, the bank hole HA is formed to surround the first opening OP1 in which the first wavelength conversion pattern WCL1 is disposed, so that ink including the first wavelength conversion material WCP1 that is not landed (or mislanded) in the first opening OP1, may flow into the bank hole HA positioned between the first opening OP1 and the second and third openings OP2 and OP3. Accordingly, the mislanded ink including the first wavelength conversion material WCP1 of the first wavelength conversion pattern WCL1 may be prevented from being introduced into the second and third openings OP2 and OP3 of the second and third sub-pixels SPX2 and SPX3, so that it is possible to prevent defects in each sub-pixel SPX that may occur due to the mislanded ink.

The volume of the bank hole HA may be adjusted so that in case that ink is introduced because of the mislanding of ink or loss of the bank, the height of the first wavelength conversion pattern WCL1 disposed in the first opening OP1 is not excessively decreased, and the introduced ink does not overflow the bank hole HA. Although not limited to the following, the volume of the bank hole HA may be smaller than the volume of the first opening OP1 surrounding the bank hole HA. The volume of the bank hole HA is formed smaller than the volume of the first opening OP1, so that although a part of the first bank BK1 between the bank hole HA and the first opening OP1 is lost, the amount of the first wavelength conversion pattern WCL1 disposed in the first opening OP1 to be introduced into the bank hole HA through the lost part, may be minimized (or reduced). Accordingly, a decrease in the height of the first wavelength conversion pattern WCL1 disposed in the first opening OP1 due to a defect in the bank layer BK may be minimized.

The bank layer BK may include the first bank BK1 and the second bank BK2 spaced apart from each other with the bank hole HA interposed therebetween.

The first bank BK1 may be disposed on the side of the first emission area TA1 with the bank hole HA interposed between the first bank BK1 and the second bank BK2. The first bank BK1 may be the bank layer BK defining the first opening OP1 overlapping the first emission area TA1 with the bank hole HA interposed between the first bank BK1 and the second bank BK2. The first opening OP1 may be defined by an inner side surface of the first bank BK1.

The second bank BK2 may be disposed on a side opposite to the side of the first emission area TA1 with the bank hole HA interposed between the first bank BK1 and the second bank BK2. The second bank BK2 may be the bank layer BK defining the second opening OP2 overlapping the second emission area TA2 and the third opening OP3 overlapping the third emission area TA3. The second bank BK2 may be disposed over the adjacent pixels PX.

Referring to FIGS. 5 and 6, the first bank BK1 and the second bank BK2 may define the bank hole HA. The bank hole HA may be defined by the side surfaces of the first bank BK1 and the second bank BK2 spaced apart from and facing each other. Specifically, the outer side surface of the first bank BK1 and a side surface of the second bank BK2 facing the outer side surface of the first bank BK1 may define the bank hole HA. On the other hand, the drawing illustrates that the bank hole HA is disposed across the boundary between the first sub-pixel SPX1 and the second and third sub-pixels SPX2 and SPX3, but the disclosure is not limited thereto. The bank hole HA may be disposed in the light blocking area BA of the first sub-pixel SPX1.

The filling layer 70 may be filled in the bank hole HA, but the disclosure is not limited thereto. As will be described below, the wavelength control structure 321 may be disposed in the bank hole HA, or a separate filling member may be filled with a spacer or the like.

According to the display device 1 or the second display substrate 30 according to the embodiment, may have the bank hole HA surrounding the first opening OP1 may be formed at the edge of the first opening OP1 in which the first wavelength conversion pattern WCL1 including the first wavelength conversion material WCP1 converting blue light or green light into red light is disposed. Accordingly, the bank hole HA between the first opening OP1 and the second and third openings OP2 and OP3 is formed, so that in a process of forming the first wavelength conversion pattern WCL1 in the first opening OP1, the material included in the first wavelength conversion pattern WCL1 may be prevented from being introduced into the second and third openings OP2 and OP3. Accordingly, the first wavelength conversion material WCP1 that converts the wavelength of light from a short wavelength to a long wavelength may be prevented from being introduced into the second wavelength conversion pattern WCL2 or the light transmitting layer TPL disposed in the second and third sub-pixels SPX2 and SPX3, so that the display quality of the display device 1 may be improved.

FIGS. 7 to 12 are schematic cross-sectional views illustrating the process steps of a method of manufacturing the second display device of FIG. 6. Hereinafter, the description of the manufacturing process will be mainly made, and the description of the disposition or shape of each member will be replaced with the description described above. FIGS. 7 to 12 illustrate that the downward direction in the drawing represents the third direction DR3 in the same manner as in FIG. 6 for simplicity of description.

Figure 7:
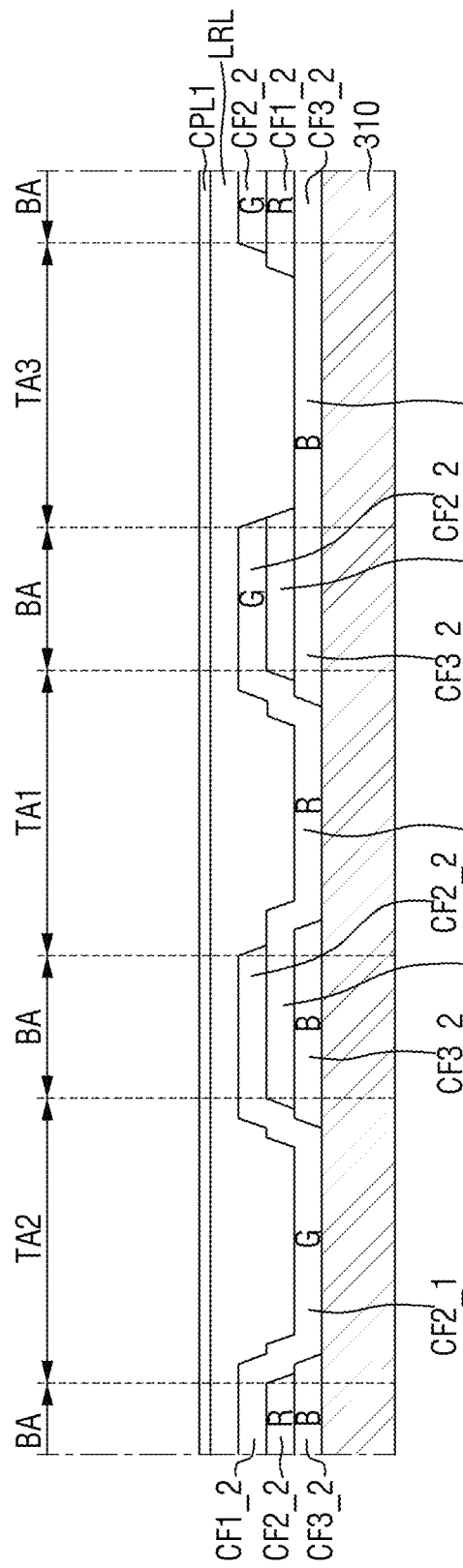
FIGS. 7 to 12 are schematic cross-sectional views illustrating the process steps of a method of manufacturing the second display device of FIG. 6.

Referring to FIG. 7, the color filter layer CFL is formed on a surface of the second substrate 310.

Specifically, the color filter layer CFL may include the first color filter layer CF1, the second color filter layer CF2, and the third color filter layer CF3. The first to third color filter layers CF1, CF2, and CF3 may be formed through exposure and development after being applied with a photosensitive organic material including a color material of a specific color. The first to third color filter layers CF1, CF2, and CF3 may be formed in the order of the third color filter layer CF3, the first color filter layer CF1, and the second color filter layer CF2, although not limited thereto.

As the third color filter layer CF3, the first color filter layer CF1, and the second color filter layer CF2 are sequentially formed on the second substrate 310, the color filter layer CFL in the light blocking area BA may be formed such that the third color filter layer CF3, the first color filter layer CF1, and the second color filter layer CF2 may be sequentially overlapped and stacked from the surface of the second substrate SUB1 in the thickness direction. However, the order of forming the color filter layer CFL is not limited thereto.

Subsequently, the low refractive layer LRL covering the patterned color filter layer CFL is formed on the patterned color filter layer CFL, and the first capping layer CPL1 is formed on the low refractive layer LRL. The low refractive layer LRL and the first capping layer CPL1 may be disposed over the entire area of the second substrate 310.

Figure 8:
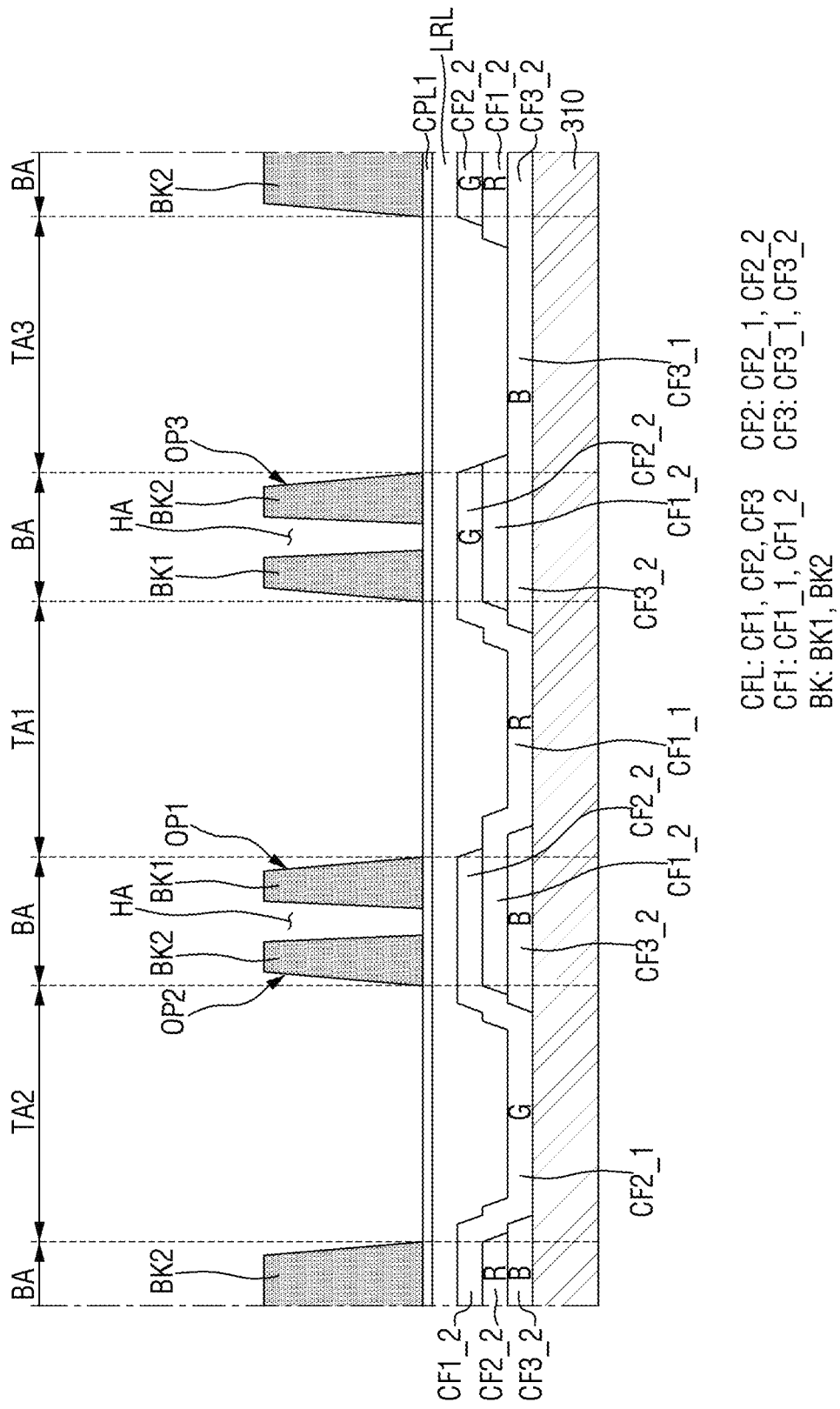

Next, referring to FIG. 8, the bank layer BK is formed on the first capping layer CPL.

Specifically, the bank layer BK which is patterned may be formed on the first capping layer CPL1. The bank layer BK may be disposed in the light blocking area BA. The patterned bank layer BK may be formed by an exposure and development process. For example, the bank layer BK may include an organic material, and the organic material may be a photosensitive organic material. In this case, the bank layer BK may be formed by applying an organic material layer for a bank layer and exposing and developing it.

In the process of forming the bank layer BK, the first to third openings OP1, OP2, and OP3 and bank holes HA defined by the bank layer BK may be formed by a process.

Figure 10:
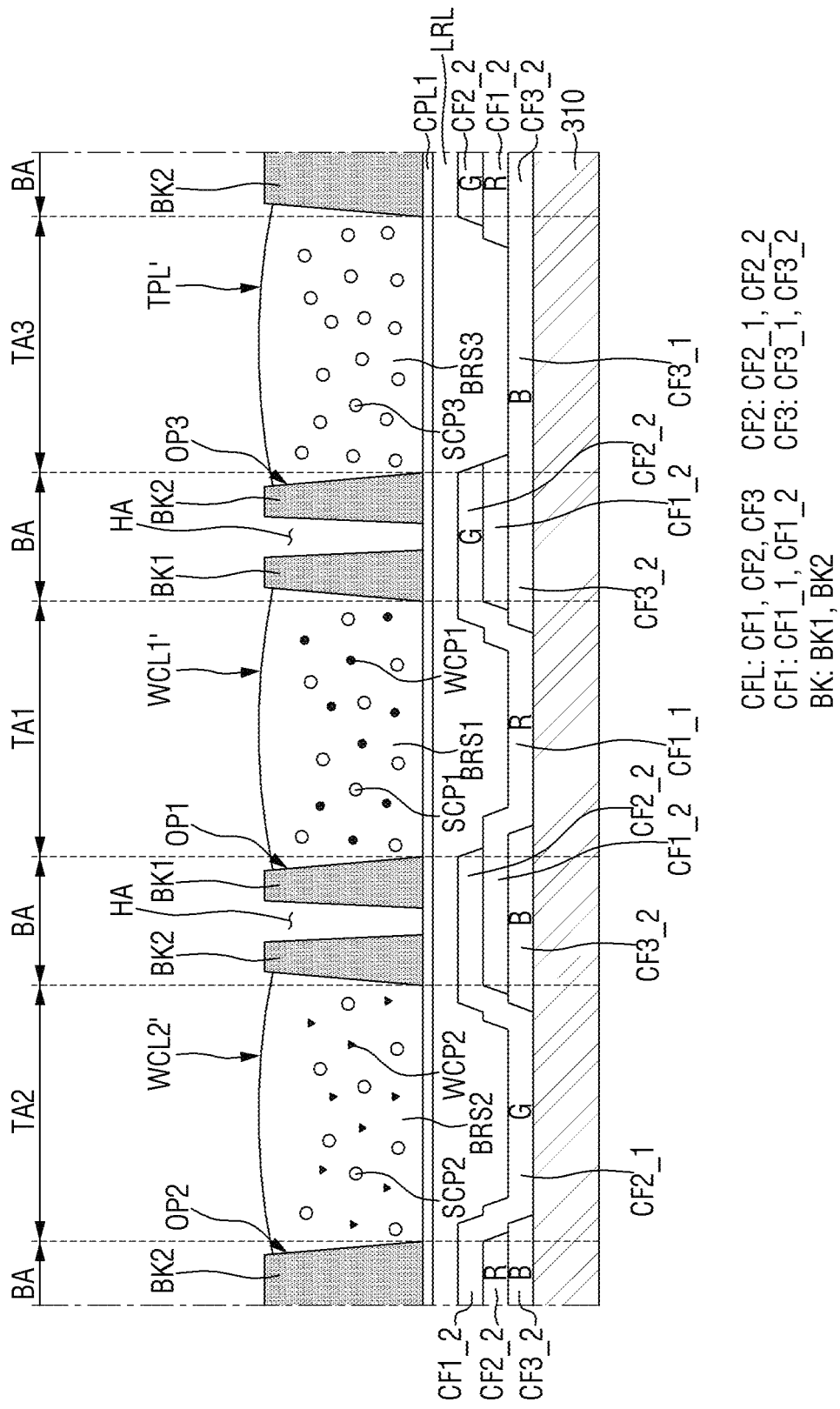
Figure 11:
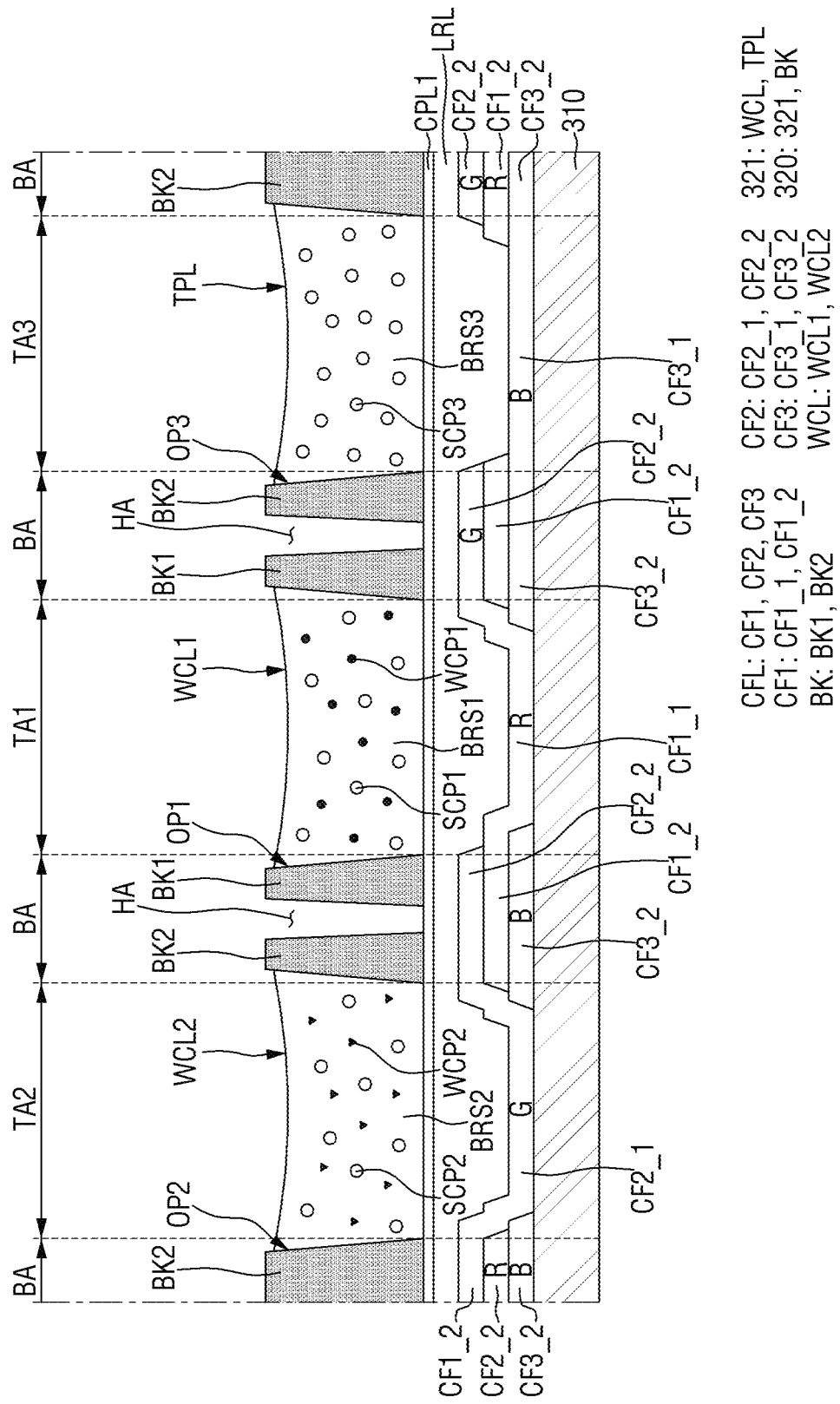

Subsequently, referring to FIGS. 9 to 11, the wavelength control structure 321 is formed in the openings OP1, OP2, and OP3 defined by the patterned bank layer BK. The wavelength control structure 321 may be formed by an inkjet printing process using an ink composition.

Specifically, the first wavelength conversion pattern WCL1 may be formed by injecting a first ink IK1 including a material included in the first wavelength conversion pattern WCL1 into the first opening OP1 overlapping the first emission area TA1. The first ink IK1 may be injected into the first opening OP1 defined by the first bank BK1 in an area overlapping the first emission area TA1. As described above, the first bank BK1 may serve as a guide for stably positioning the first ink IK1 at a desired position in order to form the first wavelength conversion pattern WCL1.

Similarly, the second wavelength conversion pattern WCL2 may be formed by injecting a second ink IK2 including a material included in the second wavelength conversion pattern WCL2 in the second opening OP2 overlapping the second emission area TA2. The second ink IK2 may be injected into the second opening OP2 defined by the second bank BK2 in an area overlapping the second emission area TA2. As described above, the second bank BK2 may serve as a guide for stably positioning the second ink IK2 at a desired position in order to form the second wavelength conversion pattern WCL2.

The light transmitting layer TPL may be formed by injecting a third ink IK3 including a material included in the light transmitting layer TPL into the third opening OP3 overlapping the third emission area TA3. The third ink IK3 may be injected into the third opening OP3 defined by the second bank BK2 in an area overlapping the third emission area TA3. As described above, the second bank BK2 may serve as a guide for stably positioning the third ink IK3 at a desired position in order to form the light transmitting layer TPL.

The first ink IK1 may include the first wavelength conversion material WCP1 and the first scatterer SCP1 included in the first wavelength conversion pattern WCL1. The first ink IK1 may further include the first base resin BRS1. The second ink IK2 may include the second wavelength conversion material WCP2 and the second scatterer SCP2 included in the second wavelength conversion pattern WCL2. The second ink IK2 may further include the second base resin BRS2. The third ink IK3 may include the third scatterer SCP3 and the third base resin BRS3 included in the light transmitting layer TPL.

The injection amounts of the first to third inks IK1, IK2, and IK3 may be determined in consideration of the surface tension, and the shrinkage of the volume after drying the first to third inks IK1, IK2, and IK3. A first wavelength conversion pattern material layer WCL1', a second wavelength conversion pattern material layer WCL2', and a light transmitting layer material layer TPL' disposed in the first to third openings OP1, OP2, and OP3, respectively, are cured to form the wavelength control layer 320 including the bank layer BK and the wavelength control structure 321 as illustrated in FIG. 11.

Figure 12:
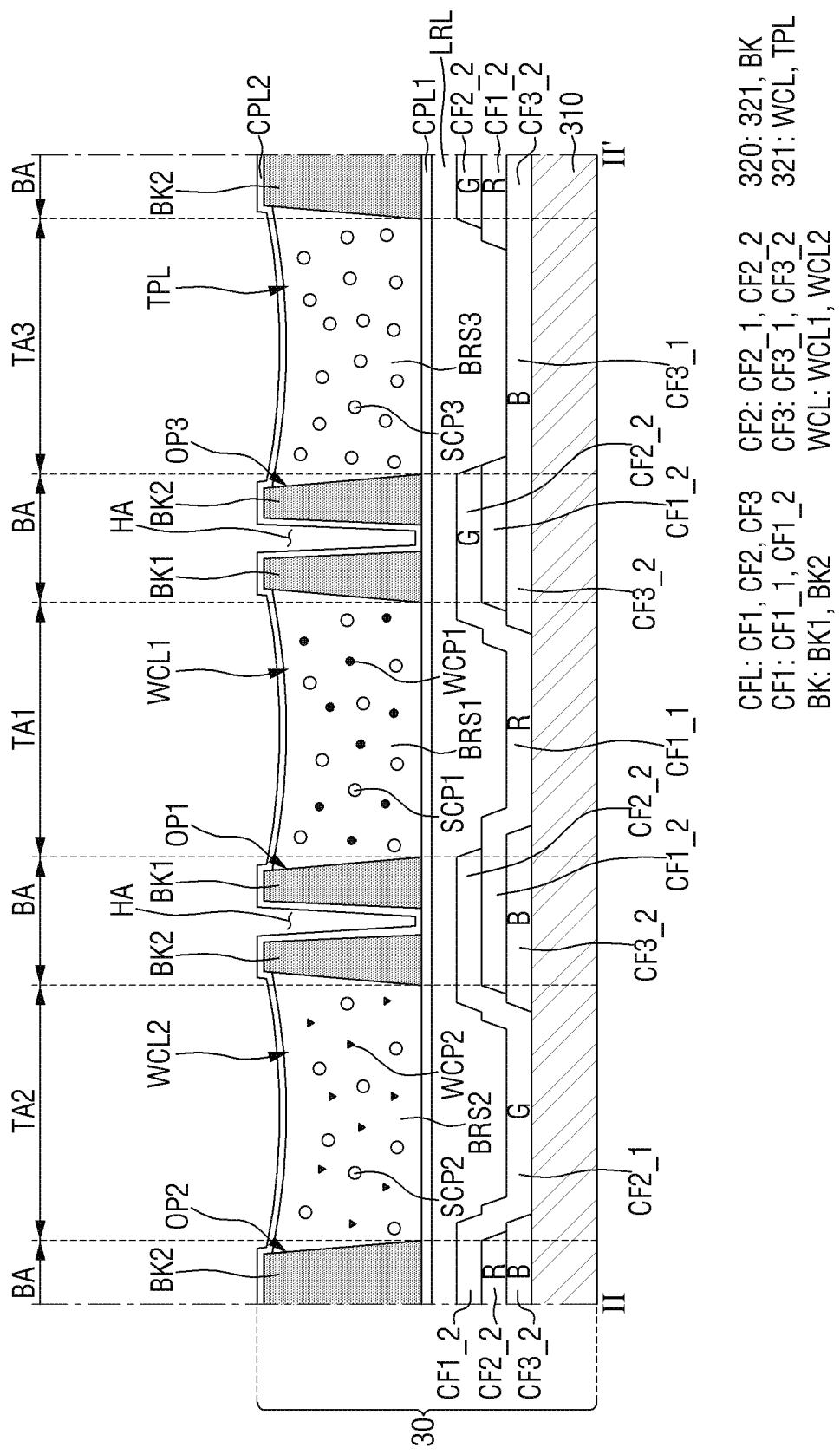

Subsequently, referring to FIG. 12, the second capping layer CPL2 may be formed on the wavelength control layer 320. The second capping layer CPL2 may be formed over the entire area of the second substrate 310.

Thereafter, the filling layer 70 may be applied between the first display substrate 10 and the second display substrate 30 to couple them. In this process, the filling layer 70 may fill the bank hole HA. Repetitive descriptions thereof will be omitted.

Hereinafter, other embodiments will be described. In the following embodiments, a description of the same components as those of the above-described embodiment will be omitted or simplified to avoid redundancy, and differences will be described.

Figure 13:
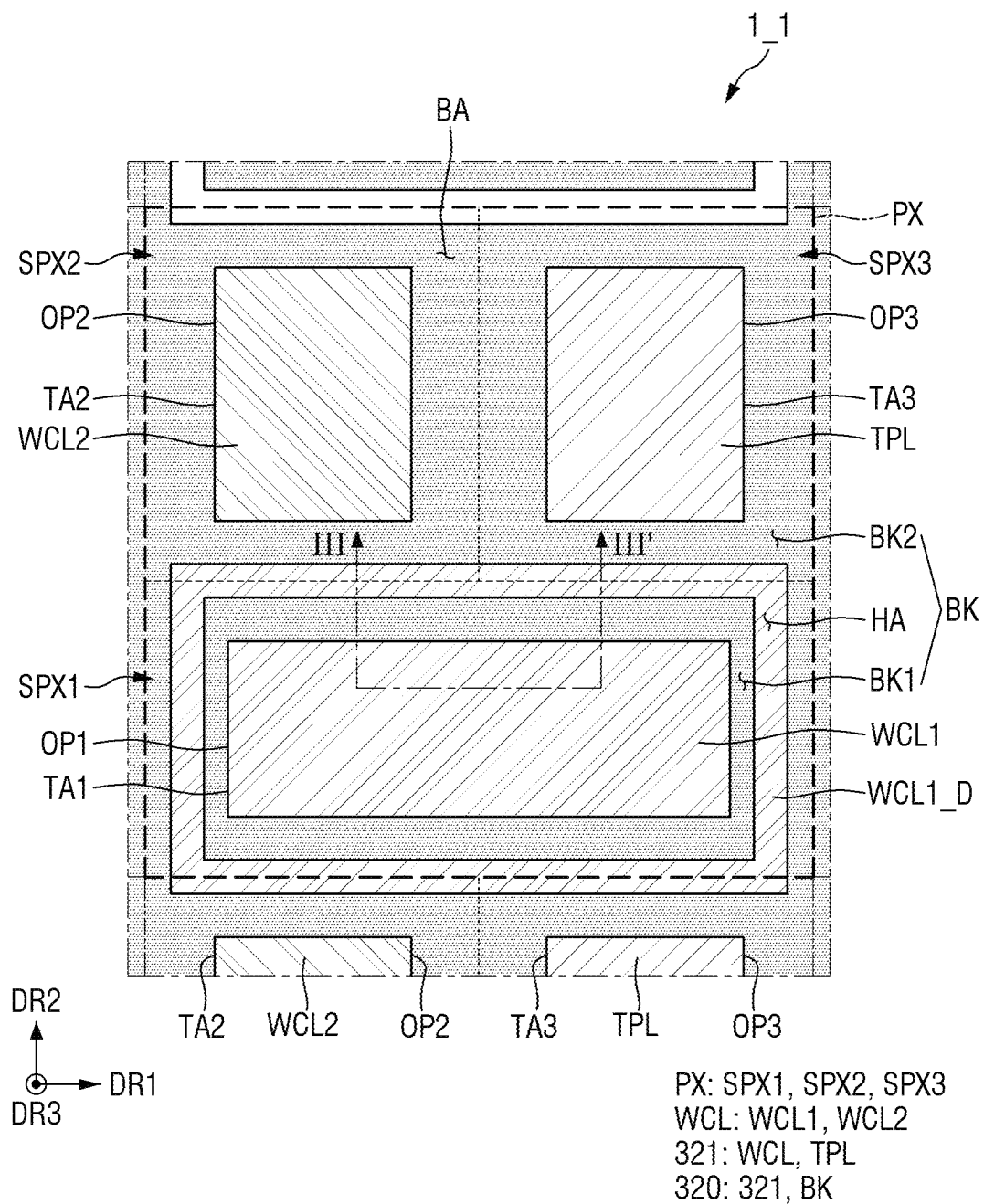
FIG. 13 is a schematic plan layout view illustrating a relative disposition of an emission area, a light blocking area, and a wavelength control layer of a display device according to another embodiment.
Figure 14:
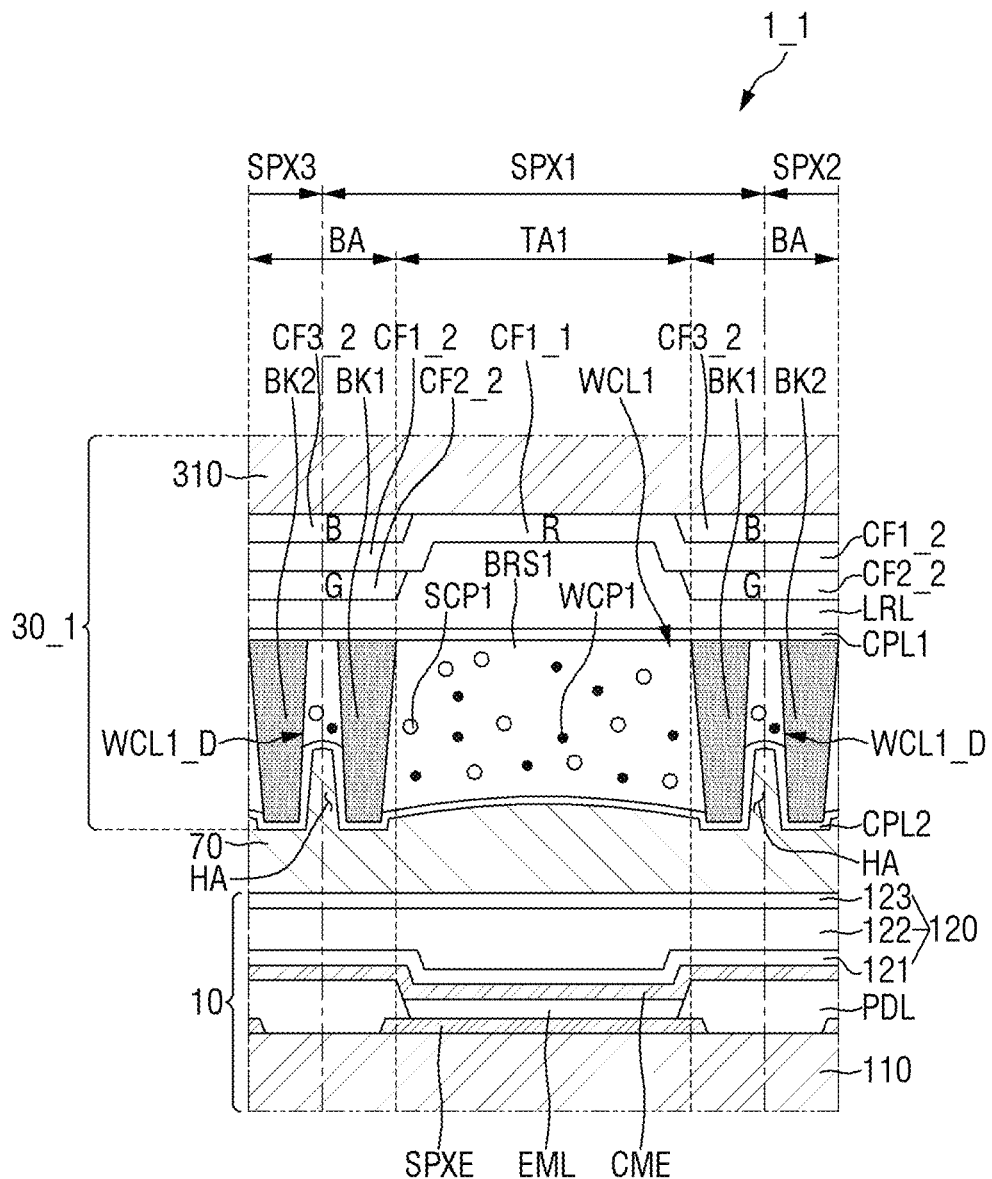
FIG. 14 is a schematic cross-sectional view of a display device taken along line in FIG. 13.
Figure 15:
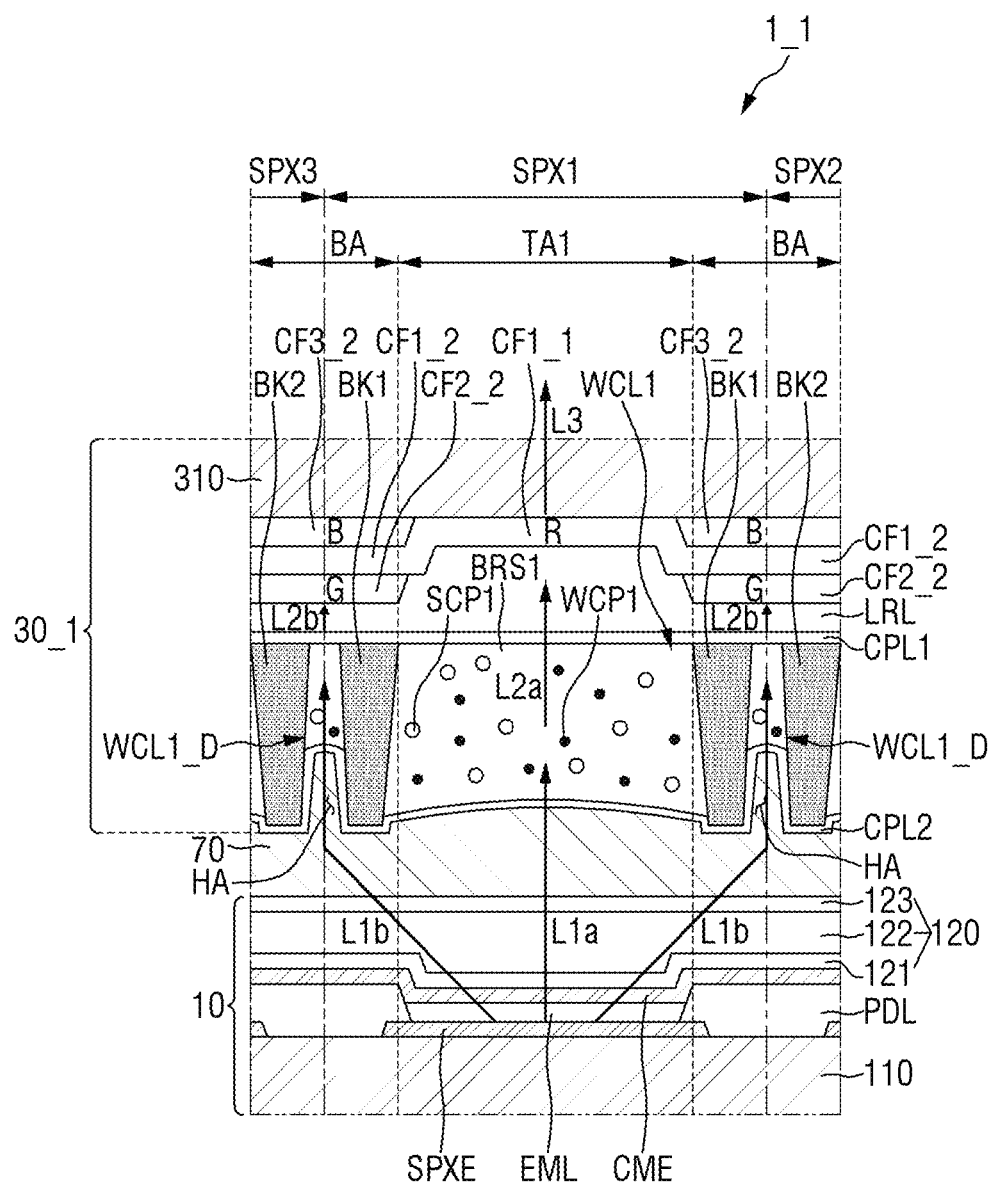
FIG. 15 is a schematic cross-sectional view illustrating a traveling direction of light emitted from an emission layer of the display device of FIG. 14.

FIG. 13 is a schematic plan layout view illustrating a relative disposition of an emission area, a light blocking area, and a wavelength control layer of a display device according to an embodiment. FIG. 14 is a schematic cross-sectional view of a display device taken along line in FIG. 13. FIG. 15 is a schematic cross-sectional view illustrating a traveling direction of light emitted from an emission layer of the display device of FIG. 14.

Referring to FIGS. 13 and 14, a first pattern WCL1_D in the bank hole HA disposed in one pixel PX is disposed in a second display substrate 30_1 included in a display device 1_1 according to the present embodiment, which is different from the embodiment of FIGS. 5 and 6.

Specifically, the first pattern WCL1_D may be further disposed in the bank hole HA surrounding the first opening OP1 of the first sub-pixel SPX1. The first pattern WCL1_D may include a material included in at least one member of the wavelength control structure 321. The first pattern WCL1_D may overlap the first to third color patterns CF1_2, CF2_2, and CF3_2 in the third direction DR3.

The first pattern WCL1_D may be formed due to the fact that the ink injected in the process of forming the wavelength control structure 321 described above with reference to FIG. 9 does not land into the corresponding opening but mislands on the adjacent bank layer BK to be introduced into the bank hole HA.

In an embodiment, the first pattern WCL1_D and the first wavelength conversion pattern WCL1 may include the same material. The volume of the first pattern WCL1_D positioned in the bank hole HA may be smaller than the volume of the wavelength control structure 321 disposed in the openings OP1, OP2, and OP3.

Figure 9:
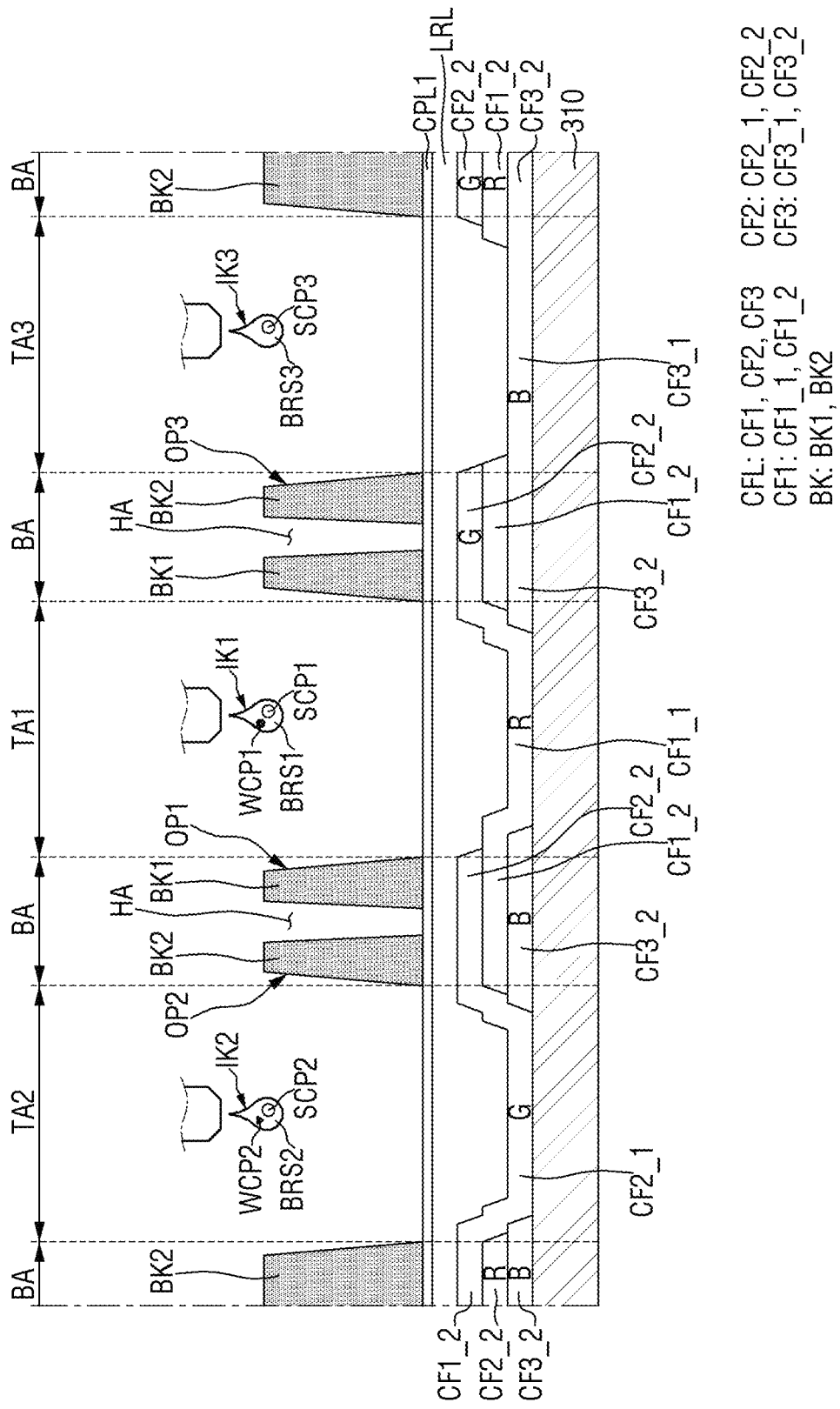

Referring to FIG. 9, if the first pattern WCL1_D includes a material included in the first wavelength conversion pattern WCL1, this may be due to the fact that the first ink IK1 (refer to FIG. 9) is introduced into the bank hole HA due to the mislanding. As the bank hole HA is disposed to surround the first opening OP1 between the second and third openings OP2 and OP3 and the first opening OP1, the mislanded first ink IK1 including the first wavelength conversion material WCP1 is introduced into the bank hole HA, so that the first ink IK1 may be prevented from being introduced into the second and third openings OP2 and OP3. Accordingly, the material included in the first wavelength conversion pattern WCL1 for converting a wavelength band of light into red light may be prevented from being introduced into the second and third openings OP2 and OP3 of the second and third sub-pixels SPX2 and SPX3 emitting green light or blue light, so that a pixel defect of the display device 1 may be prevented.

On the other hand, in the drawings, the first pattern WCL1_D and the first wavelength conversion pattern WCL1 include the same material, but the disclosure is not limited thereto. The first pattern WCL1_D and the second wavelength conversion pattern WCL2 or the light transmitting layer TPL may include the same material, or they may be mixed.

Hereinafter, a path of light emitted from the first display substrate 10 of the display device 1_1 of FIG. 14 will be described with reference to FIG. 15.

Light emitted from the light emitting layer EML of the first display substrate 10 may be incident on the wavelength control layer 320 disposed thereon.

Light L1a which is a part of light of the third color (blue light) emitted from the light emitting layer EML of the first display substrate 10 may be incident on the first wavelength conversion pattern WCL1 in the first emission area TA1. A part of the light L1a incident on the first wavelength conversion pattern WCL1 may be converted from light of the third color (blue light) to light of the first color (red light) by the first wavelength conversion material WCP1. Light L2a converted to light of the first color (red light) may be incident on the first color filter CF1_1 disposed thereon and may be transmitted through the first color filter CF1_1. Light L3 transmitted through the first color filter CF1_1 may be emitted to the outside of the display device 1_1.

Light L1b which is another part of light of the third color (blue light) emitted from the light emitting layer EML of the first display substrate 10 may be incident on the first pattern WCL1_D disposed in the bank hole HA of the light blocking area BA. A part of the light L1b incident on the first pattern WCL1_D may be converted from light of the third color (blue light) to light of the first color (red light) by the first wavelength conversion material WCP1. Light L2b converted to light of the first color (red light) may be incident on the first to third color patterns CF1_2, CF2_2, and CF3_2 disposed thereon. Accordingly, the light L2b transmitted through the first pattern WCL1_D may not be transmitted by the first to third color patterns CF1_2, CF2_2, and CF3_2 and thus may be blocked.

For example, although the first pattern including the same material as at least one member of the wavelength control structure 321 is disposed in the bank hole HA, the first to third color patterns CF1_2, CF2_2, and CF3_2 may be disposed to overlap in the third direction DR3 in the light blocking area BA, so that light may be prevented from being emitted from the light blocking area BA.

Figure 16:
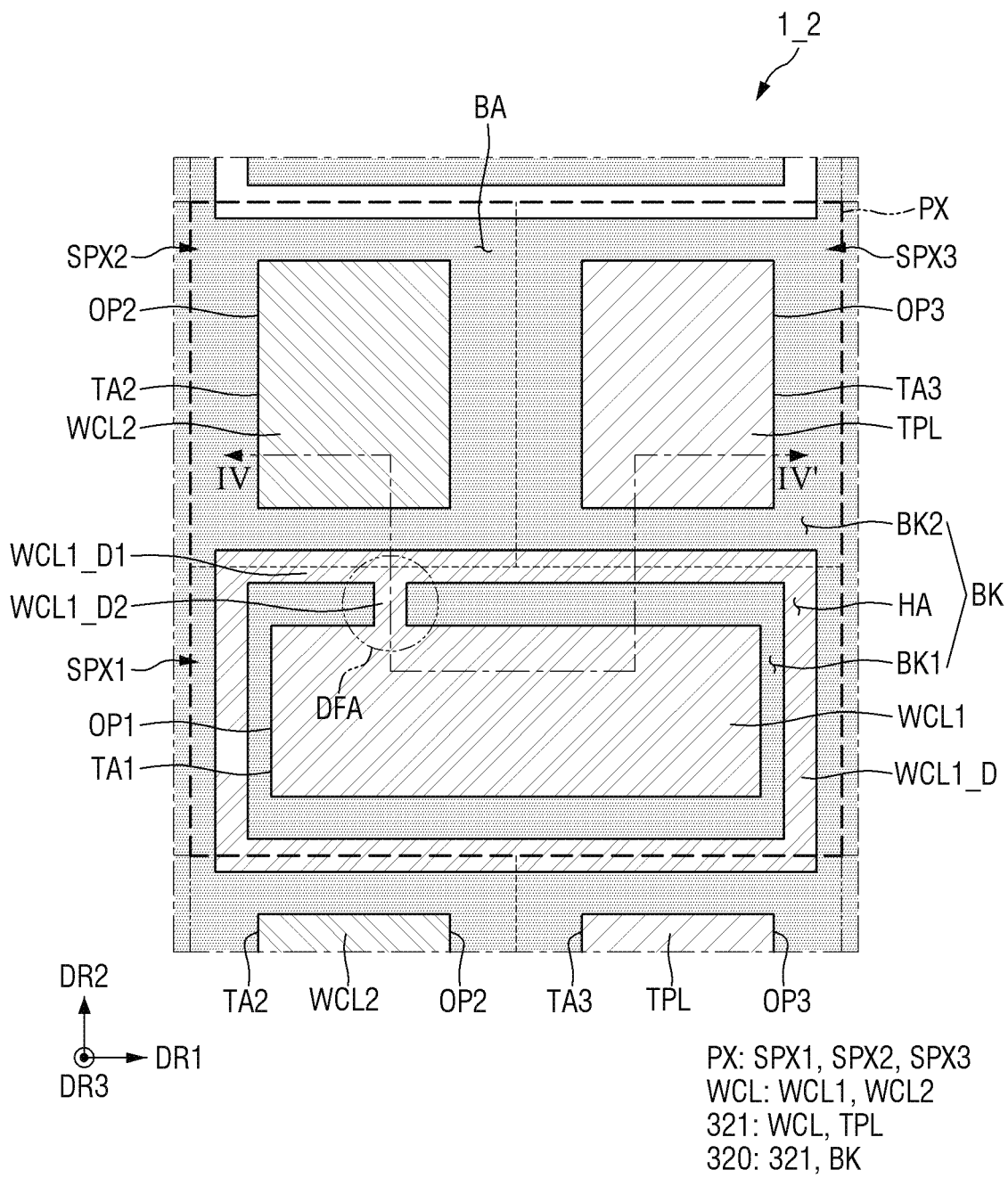
FIG. 16 is a schematic plan layout view illustrating a relative disposition of an emission area, a light blocking area, and a wavelength control layer of a display device according to still another embodiment.
Figure 17:
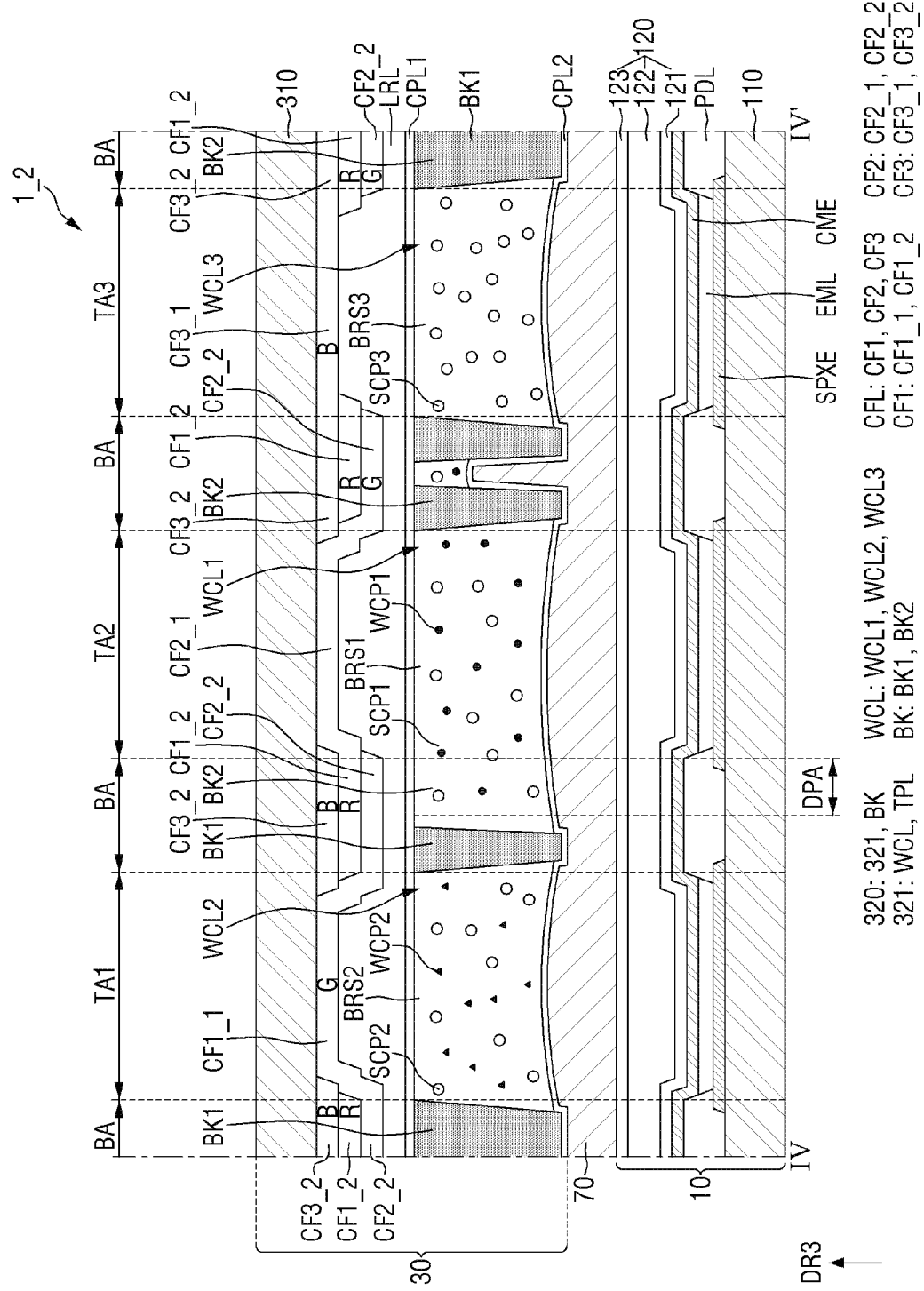
FIG. 17 is a schematic cross-sectional view of a display device taken along line IV-IV' in FIG. 16.

FIG. 16 is a schematic plan layout view illustrating a relative disposition of an emission area, a light blocking area, and a wavelength control layer of a display device according to an embodiment. FIG. 17 is a schematic cross-sectional view of a display device taken along line IV-IV' in FIG. 16.

Referring to FIGS. 16 and 17, a portion of the first bank BK1 of a display device 1_2 is lost, and a second pattern WCL1_D2 is further disposed in an area DFA in which the first bank BK1 is lost, which is different from the embodiment of FIGS. 13 and 14.

Specifically, a portion of the first bank BK1 defining the first opening OP1 of the first sub-pixel SPX1 may be lost. In this case, a first pattern WCL1_D1 may be disposed in the bank hole HA, and the second pattern WCL1_D2 may be disposed in the area DFA in which a portion of the first bank BK1 is lost.

The first and second patterns WCL1_D1 and WCL1_D2 may include a material included in at least one member of the wavelength control structure 321. The first and second patterns WCL1_D1 and WCL1_D2 may overlap the first to third color patterns CF1_2, CF2_2, and CF3_2 in the third direction.

The first and second patterns WCL1_D1 and WCL1_D2 may be formed due to the fact that a portion of the first bank BK1 is lost in the process of forming the wavelength control structure 321 described above with reference to FIG. 9, so that ink injected into each opening is introduced into the area DFA in which the first bank BK1 is lost and the bank hole HA. In an embodiment, the first and second patterns WCL1_D1 and WCL1_D2 and the first wavelength conversion pattern WCL1 may include the same material.

In the embodiment, a portion of the first bank BK1 is lost, and the bank hole HA is formed between the first bank BK1 and the second bank BK2, so that the ink introduced into the area DFA in which the first bank BK1 is lost may move to the bank hole HA. Accordingly, the first ink IK1 may be prevented from being introduced into the second and third openings OP2 and OP3 through the area DFA in which the first bank BK1 is lost. Accordingly, a pixel defect of the display device 1 may be prevented by preventing the first wavelength conversion pattern WCL1 from being introduced into the second and third openings OP2 and OP3 of the second and third sub-pixels SPX2 and SPX3.

Figure 18:
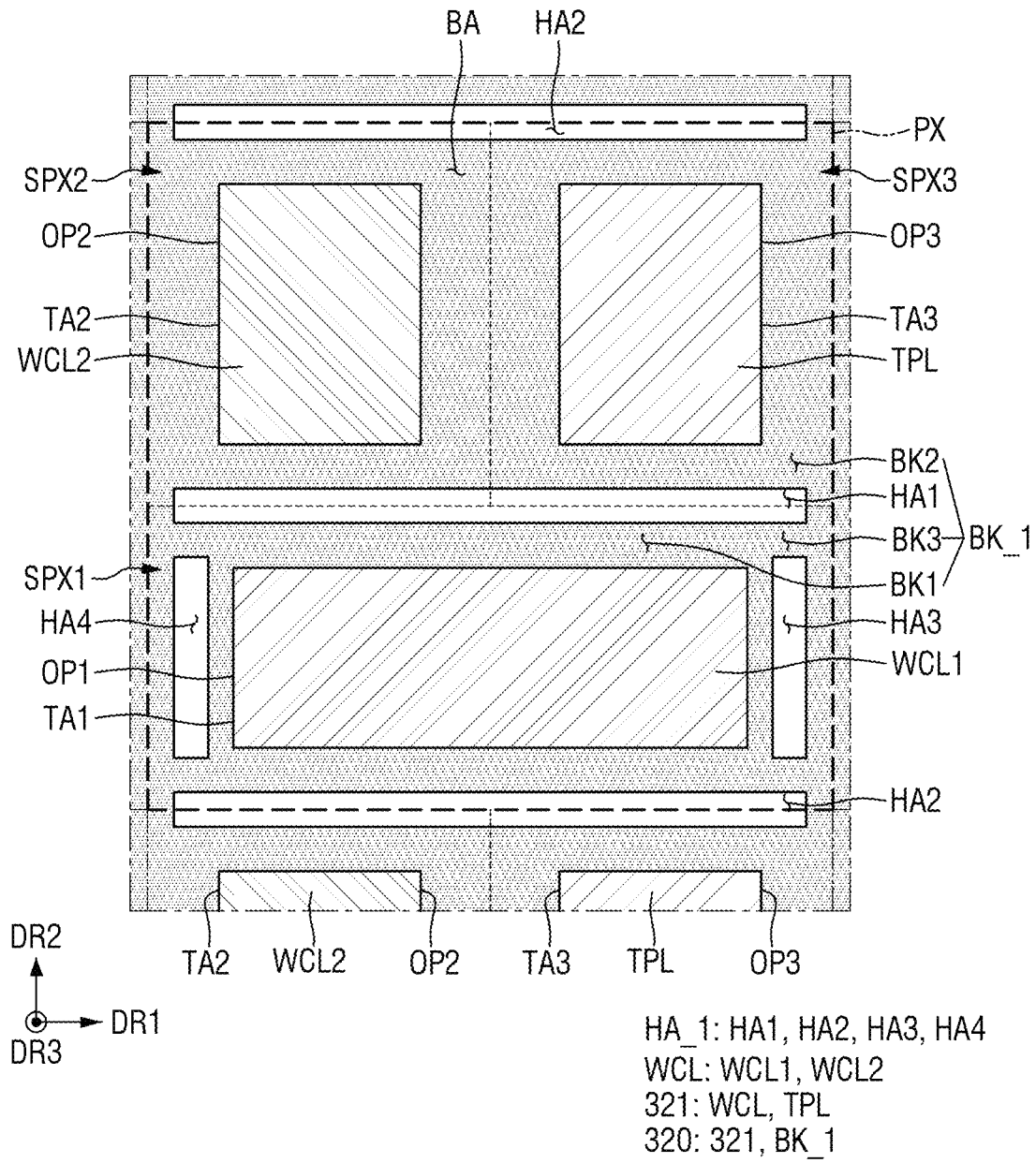
FIGS. 18 and 19 are schematic layout views illustrating various planar dispositions of a bank hole.
Figure 19:
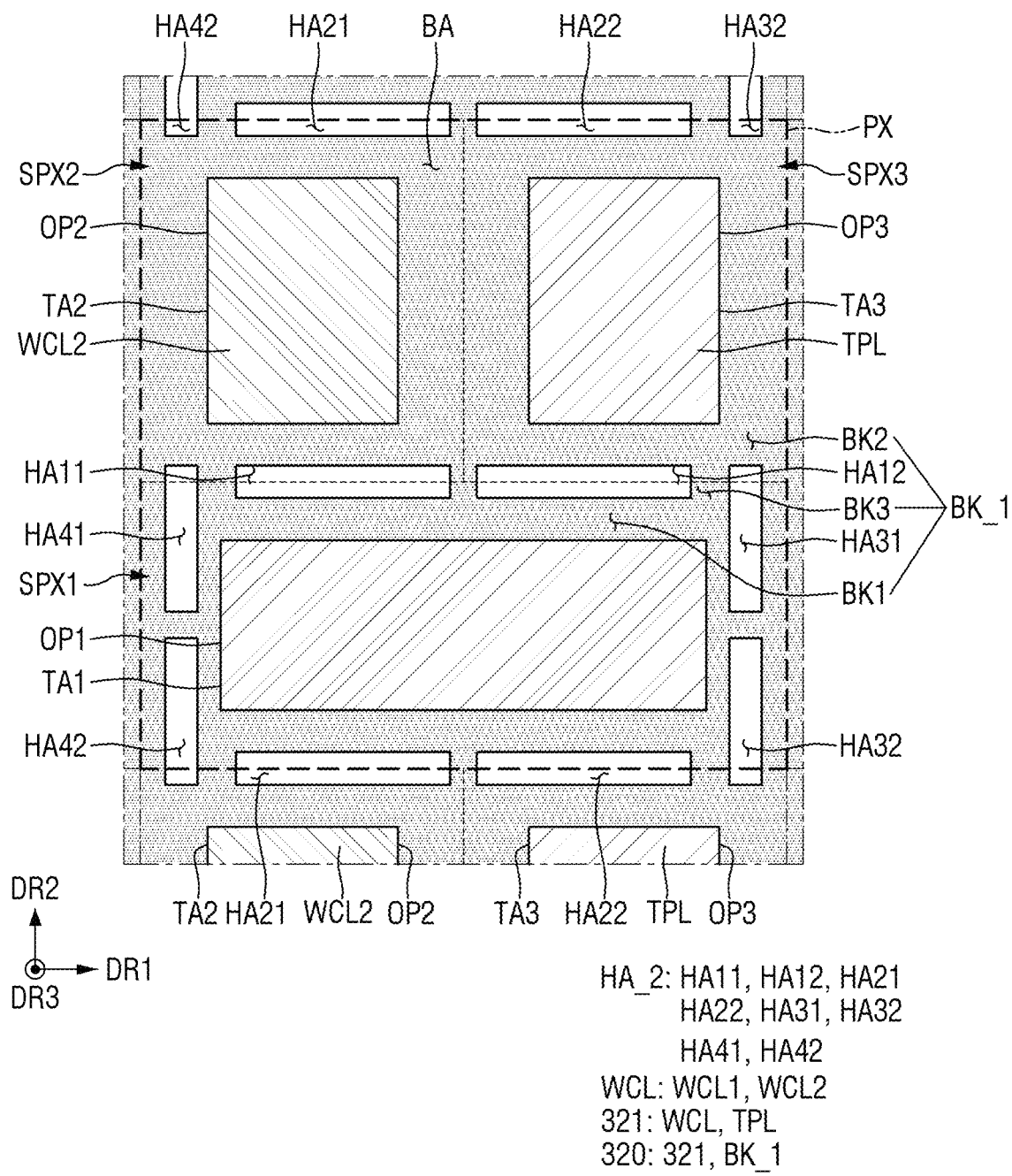

FIGS. 18 and 19 are schematic layout views illustrating various planar dispositions of a bank hole.

Referring to FIG. 18, the bank hole HA_1 may include sub-bank holes HA1, HA2, HA3, and HA4 spaced apart from each other. A third bank BK3 may be disposed between the sub-bank holes HA1, HA2, HA3 and HA4 spaced apart from each other. The sub-bank holes HA1, HA2, HA3, and HA4 may be defined by the first to third banks BK1, BK2, and BK3.

The sub-bank holes HA1, HA2, HA3, and HA4 may include first to fourth sub-bank holes HA1, HA2, HA3, and HA4. The first to fourth sub-bank holes HA1, HA2, HA3, and HA4 may be disposed on each side of the first bank BK1 and may be formed parallel to them. For example, the first sub-bank hole HA1 may be disposed on an upper side of the first opening OP1, the second sub-bank hole HA2 may be disposed on a lower side of the first opening OP1, the third sub-bank hole HA3 may be disposed on a right side of the first opening OP1, and the fourth sub-bank hole HA4 may be disposed on a left side of the first opening OP1.

The third bank BK3 may connect the first bank BK1 to the second bank BK2. Loss of the first bank BK1 may be prevented by the third bank BK3 connecting the first bank BK1 to the second bank BK2.

As the sub-bank holes HA1, HA2, HA3, and HA4 are formed to be spaced apart from each other, the volume of each of the sub-bank holes HA1, HA2, HA3, and HA3 may be reduced. Accordingly, although a portion of each bank layer BK_1 is lost and the ink injected into each of the openings OP1, OP2, and OP3 is introduced into each of the sub-bank holes HA1, HA2, HA3, and HA4 through the lost area, a decrease in the thickness of the wavelength control structure 321 of each of the sub-pixels SPX1, SPX2, and SPX3 may be suppressed or prevented.

Referring to FIG. 19, the bank hole HA_2 may include sub-bank holes HA11, HA12, HA21, HA22, HA31, HA32, HA41, and HA42 spaced apart from each other. Two of the sub-bank holes HA11, HA12, HA21, HA22, HA31, HA32, HA41, and HA42 may be disposed on each side of the first opening OP1. Accordingly, the volume of one of the sub-bank holes HA11, HA12, HA21, HA22, HA31, HA32, HA41, and HA42 is reduced, so that although a portion of each bank layer BK_1 is lost and the ink injected into each of the openings OP1, OP2, and OP3 is introduced into the sub-bank hole HA11, HA12, HA21, HA22, HA31, HA32, HA41, and HA42 through the lost area, a decrease in the thickness of the wavelength control structure 321 may be suppressed or prevented.

On the other hand, the present specification illustrates that the bank hole HA is formed only around the first opening OP1 of the first sub-pixel SPX1 emitting red light, but the bank hole HA may further include another bank hole disposed around the second and third openings OP2 and OP3 of the second and third sub-pixels SPX2 and SPX3.

Figure 20:
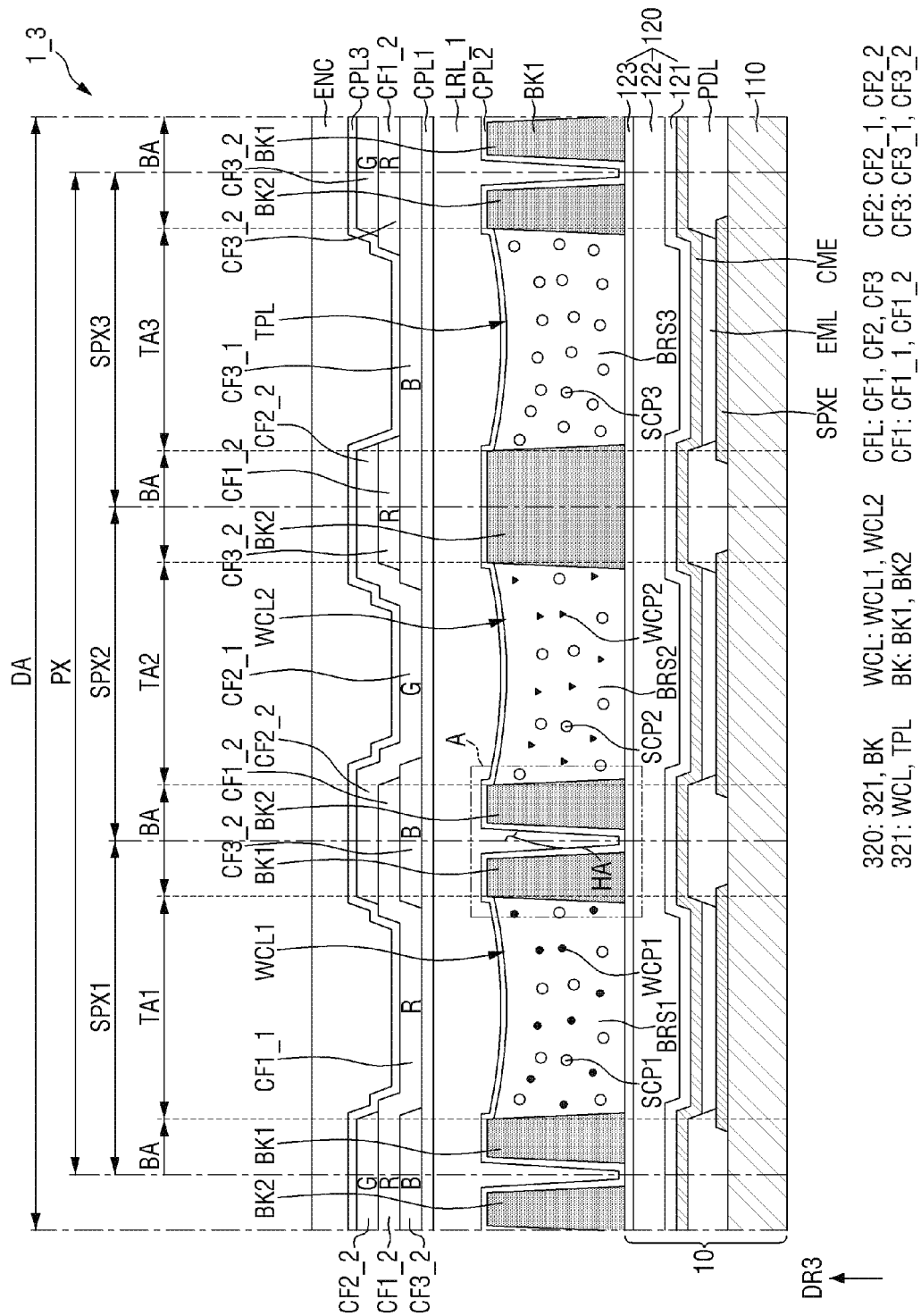
FIG. 20 is a schematic cross-sectional view of a display device according to still another embodiment.
Figure 21:
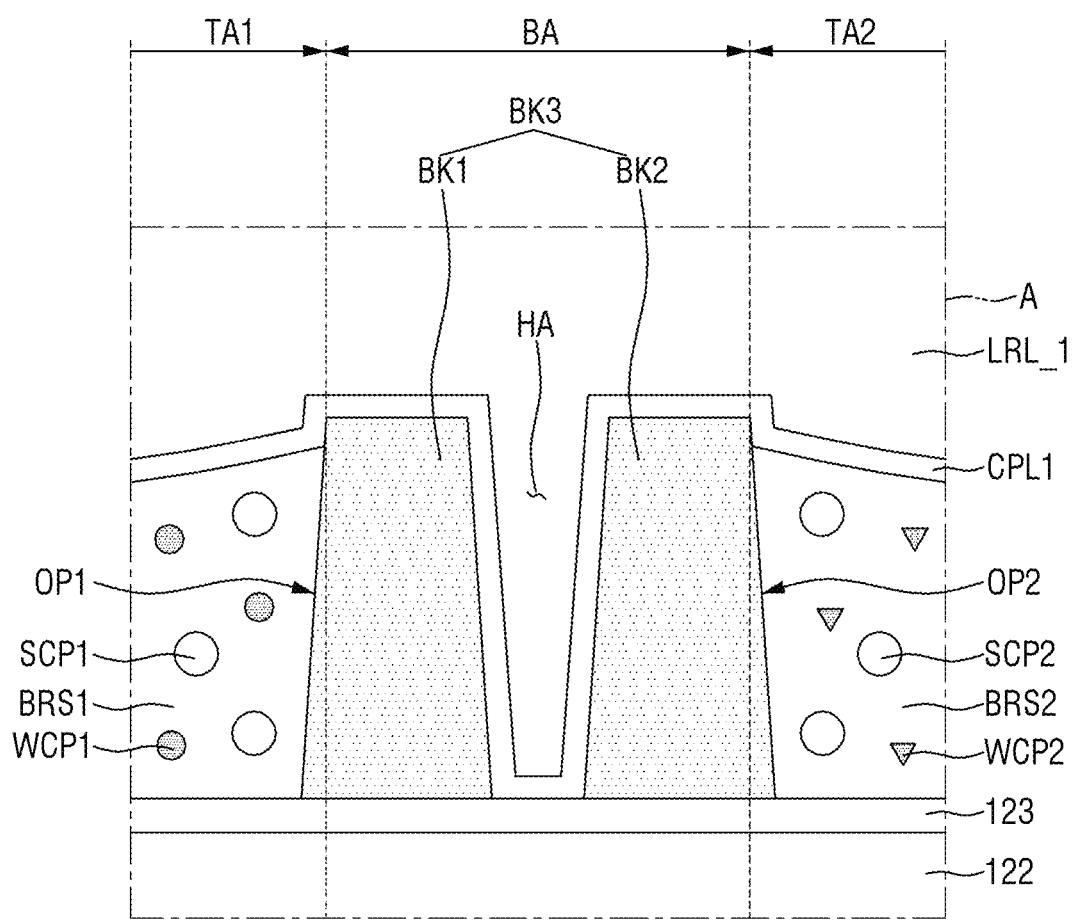
FIG. 21 is an enlarged cross-sectional view schematically illustrating an example of area A of FIG. 20.

FIG. 20 is a schematic cross-sectional view of a display device according to an embodiment. FIG. 21 is a schematic enlarged cross-sectional view illustrating an example of area A of FIG. 20.

Referring to FIGS. 20 and 21, a display device 1_3 according to an embodiment is different from the embodiment of FIG. 4 at least in that the wavelength control layer 320, the low refractive layer LRL_1, and the color filter layer CFL are sequentially stacked from the first display substrate 10, the filling layer 70 and the sealing member 50, which are disposed between the first display substrate 10 and the second display substrate 30 illustrated in FIGS. 2 and 4, are omitted, and an encapsulation layer ENC disposed on the color filter layer CFL is further included. In the embodiment, the second substrate 310 may be omitted.

Specifically, the wavelength control layer 320 may be disposed on the second inorganic layer 123. The wavelength control layer 320 may include the bank layer BK and the wavelength control structure 321. The bank layer BK may be directly disposed on the second inorganic layer 123. The wavelength control structure 321 may be disposed in the openings OP1, OP2, and OP3 defined by the bank layer BK and may be directly disposed on the second inorganic layer 123.

The second capping layer CPL2 may be disposed on the wavelength control layer 320. The second capping layer CPL2 may cover the top surface of the wavelength control layer 320 and the second inorganic layer 123 exposed by the bank hole HA of the bank layer BK of the wavelength control layer 320.

The low refractive layer LRL_1 may be disposed on the second capping layer CPL2. The low refractive layer LRL_1 may fill the bank hole HA of the bank layer BK. The first capping layer CPL1 may be disposed on the low refractive layer LRL_1. The color filter layer CFL may be disposed on the first capping layer CPL1. A third capping layer CPL3 may be disposed on the color filter layer CFL.

The encapsulation layer ENC may be disposed on the third capping layer CPL3. The encapsulation layer ENC may be disposed in both the display area DA and the non-display area NDA. For example, the encapsulation layer ENC may include at least one inorganic film to prevent permeation of oxygen or moisture. The encapsulation layer ENC may include at least one organic layer to protect the display device 1_3 from foreign matters such as dust.

Figure 22:
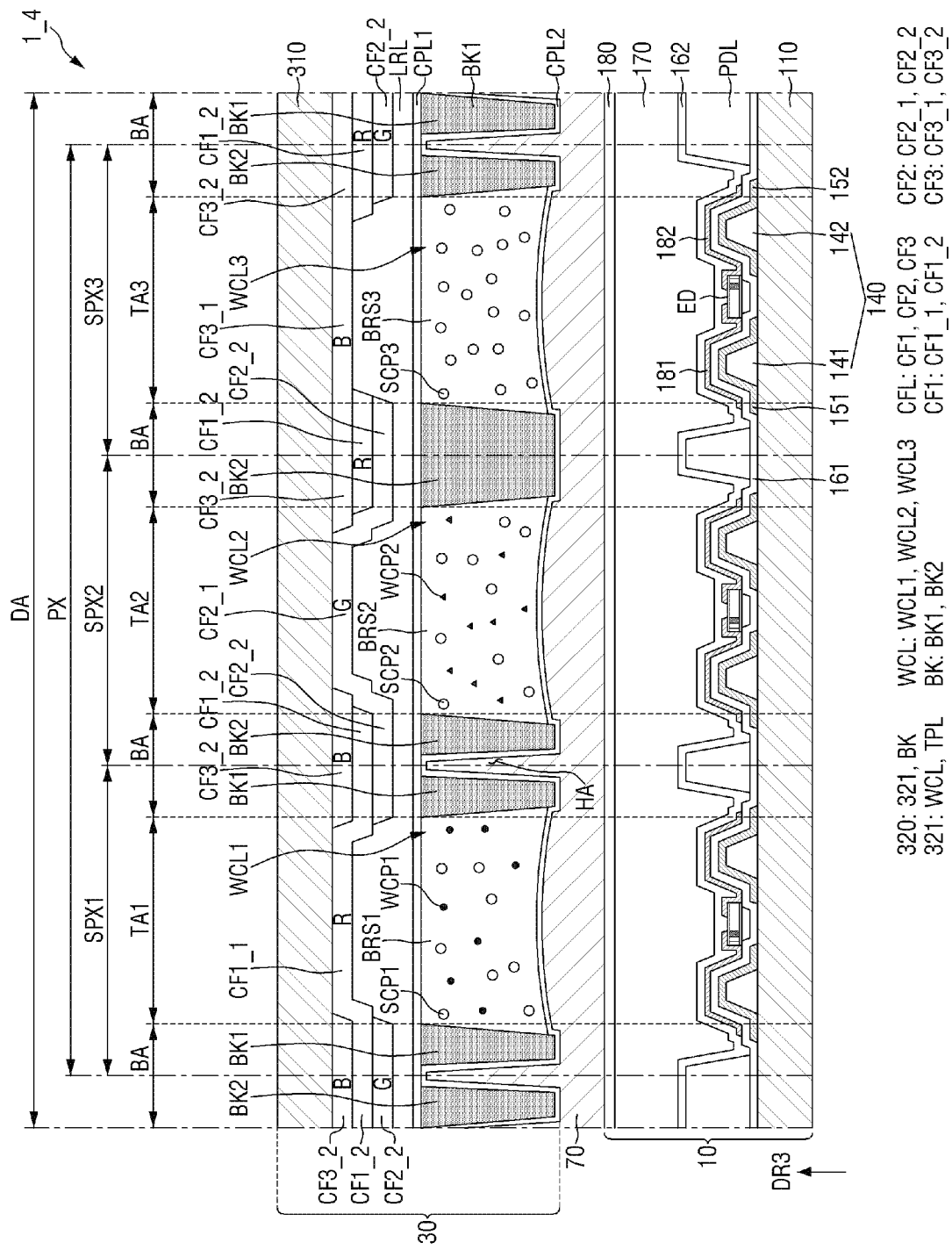
FIG. 22 is a schematic cross-sectional view of a display device according to still another embodiment.

FIG. 22 is a schematic cross-sectional view of a display device according to an embodiment.

Referring to FIG. 22, a display device 1_4 according to an embodiment is different from the display device 1 of FIG. 4 at least in that the light emitting element of a first display substrate 10_1 includes an inorganic light emitting element.

Specifically, the first display substrate 10_1 may include the first substrate 110 and light emitting elements ED disposed on the first substrate 110. The light emitting element ED may include an inorganic light emitting diode.

A first bank 140 may be disposed on the first substrate 110. The first bank 140 may include a first sub-bank 141 and a second sub-bank 142 spaced apart from each other. An area in which the light emitting elements ED are disposed may be provided in a separation space between the first sub-bank 141 and the second sub-bank 142.

A first electrode 151 and a second electrode 152 may be disposed on the first bank 140. The first electrode 151 and the second electrode 152 may be disposed on the first sub-bank 141 and the second sub-bank 142, respectively.

A first insulating layer 161 may be disposed on the first and second electrodes 151 and 152. The first insulating layer 161 may be disposed over the entire surface of the first substrate 110. The first insulating layer 161 may insulate the first electrode 151 and the second electrode 152 from each other.

The light emitting element ED may be disposed on the first insulating layer 161 in a space between the first sub-bank 141 and the second sub-bank 142. The light emitting element ED may be disposed such that both ends thereof are positioned on the first electrode 151 and the second electrode 152, respectively. The light emitting element ED disposed in each sub-pixel SPX may include an active layer and a semiconductor layer having the same material, and may emit light of the same color. In this case, light emitted from each sub-pixel SPX may have the same color. For example, the light emitting elements ED may emit light of a third color or blue light.

First and second contact electrodes 181 and 182 may be disposed on the first insulating layer 161. The first contact electrode 181 may be disposed on the first electrode 151 and may contact each of the first electrode 151 and a first end of the light emitting element ED. The second contact electrode 182 may be disposed on the second electrode 152 and may contact each of the second electrode 152 and a second end of the light emitting element ED.

A second insulating layer 162 may be disposed on the first and second contact electrodes 181 and 182. The second insulating layer 162 may be disposed on the entire surface of the first substrate 110. The second insulating layer 162 may protect members disposed therebelow from the outside.

A planarization layer 170 may be disposed on the second insulating layer 162. The planarization layer 170 may planarize a surface step formed by the members disposed therebelow. The top surface of the planarization layer 170 may be formed to be flat. A fourth capping layer 180 may be disposed on the planarization layer 170. The fourth capping layer 180 may seal the first display substrate 10 disposed therebelow.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a first substrate including:
      a first emission area emitting light of a first color;
      a second emission area emitting light of a second color having a peak wavelength shorter than a peak wavelength of light of the first color; and
      a light blocking area which blocks light;
   a color filter layer disposed on a surface of the first substrate; and
   a wavelength control layer disposed on the color filter layer and including a bank layer and a wavelength control structure, wherein
   the bank layer is disposed in the light blocking area on the color filter layer, and includes:
      a first trapezoidal-shaped bank;
      a second trapezoidal-shaped bank spaced apart from the first trapezoidal-shaped bank;
      a first opening overlapping the first emission area;
      a second opening overlapping the second emission area; and
      a bank hole disposed in the light blocking area directly between the first trapezoidal-shaped bank and the second trapezoidal-shaped bank,
   the wavelength control structure is disposed in the first opening and the second opening of the bank layer,
   the first opening, the second opening, and the bank hole are spaced apart from each other, and
   the bank hole surrounds an edge of the first opening.

2. The display device of claim 1, wherein
   the first color is red, and
   the second color is blue or green.

3. The display device of claim 1, wherein
   the color filter layer includes:
      a first color filter layer that selectively transmits light of the first color; and
      a second color filter layer that selectively transmits light of the second color,
   the first color filter layer includes:
      a first color filter disposed in the first emission area; and
      a first color pattern disposed in the light blocking area,
   the second color filter layer includes:
      a second color filter disposed in the second emission area; and
      a second color pattern disposed in the light blocking area, and
   the first color pattern and the second color pattern overlap each other in the light blocking area.

4. The display device of claim 3, wherein
   the color filter layer includes a third color filter layer that selectively transmits light of a third color different from the first color and the second color, and
   the third color filter layer is disposed in the light blocking area, and includes a third color pattern overlapping the first color pattern and the second color pattern.

5. The display device of claim 4, wherein the bank hole overlaps the first color pattern, the second color pattern, and the third color pattern.

6. The display device of claim 4, wherein
   the first opening overlaps the first color filter, and
   the second opening overlaps the second color filter.

7. The display device of claim 1, wherein the bank hole is disposed between the first opening and the second opening.

8. The display device of claim 7, wherein
   the bank layer includes a first bank and a second bank spaced apart from each other,
   the bank hole is disposed between the first bank and the second bank,
   the first opening is defined by the first bank, and
   the second opening is defined by the second bank.

9. The display device of claim 8, wherein a sidewall of the first bank and a sidewall of the second bank are adjacent to each other, spaced apart from each other, and face each other.

10. The display device of claim 8, wherein the bank hole includes a plurality of sub-bank holes spaced apart from each other along the edge of the first opening in a plan view.

11. The display device of claim 1, wherein
    the wavelength control structure includes a first wavelength conversion pattern disposed in the first opening, and
    the first wavelength conversion pattern includes:
       a first base resin; and
       a first wavelength conversion material dispersed in the first base resin and converting a peak wavelength of light into the peak wavelength of light of the first color.

12. The display device of claim 11, wherein
    the wavelength control structure includes a second wavelength conversion pattern disposed in the second opening, and
    the second wavelength conversion pattern includes:
       a second base resin; and
       a second wavelength conversion material dispersed in the second base resin and converting the peak wavelength of light into the peak wavelength of light of the second color.

13. The display device of claim 12, wherein at least a part of the bank hole is disposed between the first wavelength conversion pattern and the second wavelength conversion pattern.

14. The display device of claim 11, wherein
    the wavelength control structure includes a light transmitting layer disposed in the second opening, and
    the light transmitting layer includes:
       a second base resin; and
       light scattering particles dispersed in the second base resin.

15. The display device of claim 11, further comprising a first pattern disposed in the bank hole and including the first wavelength conversion material.

16. The display device of claim 1, further comprising:
a first capping layer comprising an inorganic material disposed on the color filter layer; and
a second capping layer comprising an inorganic material disposed on and directly over a center of the wavelength control layer, wherein
the wavelength control layer is disposed on and directly over a center of the first capping layer,
the first capping layer and the second capping layer directly contact each other in a region overlapping the bank hole, and
the second capping layer is partially disposed in the bank hole.

17. The display device of claim 1, wherein the light blocking area surrounds the first emission area and the second emission area.

18. The display device of claim 1, wherein
a volume of the bank hole is smaller than a volume of the first opening, and
the volume of the bank hole is smaller than a volume of the second opening.

19. The display device of claim 1, further comprising a low refractive layer disposed between the color filter layer and the wavelength control layer,
wherein the low refractive layer fills a part of the bank hole.

20. The display device of claim 1, further comprising:
a second substrate facing the surface of the first substrate;
a first electrode disposed on a surface of the second substrate;
a pixel defining layer disposed on the first electrode and exposing at least a part of the first electrode, wherein the first light emitting layer is disposed on the first electrode exposed by the pixel defining layer,
a second electrode disposed on the first light emitting layer; and
a filling layer consisting of an organic material disposed between the second electrode and the wavelength control layer, wherein
the filling layer fills a part of the bank hole.

* * * * *